(12) United States Patent
Hirakata et al.

(10) Patent No.: US 10,125,955 B2
(45) Date of Patent: Nov. 13, 2018

(54) LIGHT-EMITTING DEVICE

(71) Applicant: Semiconductor Energy Laboratory Co., Ltd., Atsugi-shi, Kanagawa-ken (JP)

(72) Inventors: Yoshiharu Hirakata, Ebina (JP); Akio Endo, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/617,334

(22) Filed: Jun. 8, 2017

(65) Prior Publication Data
US 2017/0268750 A1 Sep. 21, 2017

Related U.S. Application Data

(63) Continuation of application No. 14/324,678, filed on Jul. 7, 2014, now Pat. No. 9,719,665.

(30) Foreign Application Priority Data

| Jul. 12, 2013 | (JP) | ................................. 2013-146291 |
| Jul. 12, 2013 | (JP) | ................................. 2013-146293 |
| Dec. 2, 2013 | (JP) | ................................. 2013-249155 |

(51) Int. Cl.
*F21V 19/02* (2006.01)
*F21V 15/01* (2006.01)
(Continued)

(52) U.S. Cl.
CPC ......... *F21V 15/012* (2013.01); *F21Y 2105/00* (2013.01); *F21Y 2115/20* (2016.08);
(Continued)

(58) Field of Classification Search
CPC ............... F21V 15/012; F21Y 2115/20; H01L 2251/5338
(Continued)

(56) References Cited

U.S. PATENT DOCUMENTS

| 6,372,608 B1 | 4/2002 | Shimoda et al. |
| 6,819,304 B2 | 11/2004 | Branson |

(Continued)

FOREIGN PATENT DOCUMENTS

| CN | 103021277 A | 4/2013 |
| CN | 103069473 A | 4/2013 |

(Continued)

OTHER PUBLICATIONS

International Search Report (Application No. PCT/JP2014/067853) dated Oct. 7, 2014.

(Continued)

*Primary Examiner* — Vip Patel
(74) *Attorney, Agent, or Firm* — Robinson Intellectual Property Law Office; Eric J. Robinson

(57) ABSTRACT

A light-emitting device includes a strip-like high flexibility region and a strip-like low flexibility region arranged alternately in a direction. The high flexibility region includes a flexible light-emitting panel. The low flexibility region includes the light-emitting panel and a support panel having a lower flexibility than that of the light-emitting panel and overlapping with the light-emitting panel. it is preferable that the light-emitting panel include an external connection electrode and that a length in the direction of a low flexibility region A that overlaps with the external connection electrode be longer than a length in the direction of a low flexibility region B that is closest to the region A.

16 Claims, 22 Drawing Sheets

(51) Int. Cl.
*F21Y 105/00* (2016.01)
*F21Y 115/20* (2016.01)
*H01L 27/32* (2006.01)

(52) U.S. Cl.
CPC ........ *H01L 27/323* (2013.01); *H01L 27/3262* (2013.01); *H01L 2227/323* (2013.01); *H01L 2251/5338* (2013.01)

(58) Field of Classification Search
USPC .................................................. 362/418, 419
See application file for complete search history.

(56) References Cited

U.S. PATENT DOCUMENTS

| | | |
|---|---|---|
| 6,828,727 B2 | 12/2004 | Yamazaki |
| 7,027,110 B2 | 4/2006 | Akiyama et al. |
| 7,242,445 B2 | 7/2007 | Akiyama et al. |
| 8,654,095 B1 | 2/2014 | Cho et al. |
| 9,013,884 B2 | 4/2015 | Fukuma et al. |
| 9,164,354 B2 | 10/2015 | Ahlstedt et al. |
| 9,287,341 B2 | 3/2016 | Cheon et al. |
| 9,460,643 B2 | 10/2016 | Hirakata et al. |
| 2002/0027636 A1 | 3/2002 | Yamada |
| 2002/0033783 A1 | 3/2002 | Koyama |
| 2003/0032210 A1 | 2/2003 | Takayama et al. |
| 2004/0183958 A1 | 9/2004 | Akiyama et al. |
| 2004/0239586 A1 | 12/2004 | Cok |
| 2006/0125973 A1 | 6/2006 | Akiyama et al. |
| 2007/0085845 A1 | 4/2007 | Kikuchi et al. |
| 2007/0097014 A1 | 5/2007 | Solomon et al. |
| 2008/0303782 A1 | 12/2008 | Grant et al. |
| 2009/0239320 A1 | 9/2009 | Takayama et al. |
| 2010/0056223 A1 | 3/2010 | Choi et al. |
| 2010/0064244 A1 | 3/2010 | Kilpatrick, II et al. |
| 2010/0066643 A1 | 3/2010 | King et al. |
| 2010/0085382 A1 | 4/2010 | Lundqvist et al. |
| 2010/0164888 A1 | 7/2010 | Okumura et al. |
| 2011/0095975 A1 | 4/2011 | Hwang et al. |
| 2011/0109591 A1 | 5/2011 | Kurokawa et al. |
| 2011/0111798 A1 | 5/2011 | Jeon et al. |
| 2011/0216064 A1 | 9/2011 | Dahl et al. |
| 2011/0241998 A1 | 10/2011 | Mckinney et al. |
| 2012/0217516 A1 | 8/2012 | Hatano et al. |
| 2012/0262367 A1 | 10/2012 | Chiu et al. |
| 2013/0002583 A1 | 1/2013 | Jin et al. |
| 2013/0010405 A1 | 1/2013 | Rothkopf et al. |
| 2013/0050270 A1 | 2/2013 | Joo |
| 2013/0321340 A1 | 12/2013 | Seo et al. |
| 2014/0098028 A1 | 4/2014 | Kwak et al. |
| 2014/0152576 A1 | 6/2014 | Kim et al. |
| 2014/0223343 A1 | 8/2014 | Lee et al. |
| 2014/0247544 A1 | 9/2014 | Ryu |
| 2014/0320447 A1 | 10/2014 | Kung |
| 2014/0347287 A1 | 11/2014 | Lee et al. |
| 2014/0361980 A1 | 12/2014 | Iwaki et al. |
| 2015/0022515 A1 | 1/2015 | Ikeda et al. |
| 2015/0035777 A1 | 2/2015 | Hirakata et al. |
| 2015/0277496 A1 | 10/2015 | Reeves et al. |

FOREIGN PATENT DOCUMENTS

| | | |
|---|---|---|
| CN | 103155188 A | 6/2013 |
| EP | 1785805 A | 5/2007 |
| EP | 2541371 A | 1/2013 |
| EP | 2573644 A | 3/2013 |
| EP | 2634765 A | 9/2013 |
| JP | 2003-174153 A | 6/2003 |
| JP | 2004-279867 A | 10/2004 |
| JP | 2005-112251 A | 4/2005 |
| JP | 2005-114759 A | 4/2005 |
| JP | 2008-293680 A | 12/2008 |
| JP | 2010-099122 A | 5/2010 |
| JP | 2010-244698 A | 10/2010 |
| JP | 2013-015836 A | 1/2013 |
| KR | 10-0598746 | 7/2006 |
| TW | 200736884 | 10/2007 |
| WO | WO-2001/053919 | 7/2001 |

OTHER PUBLICATIONS

Written Opinion (Application No. PCT/JP2014/067853) dated Oct. 7, 2014.
Chinese Office Action (Application No. 201480039807.4) dated Jan. 3, 2017.
Taiwanese Office Action (Application No. 102123307) dated May 9, 2018.

LIGHT-EMITTING DEVICE

TECHNICAL FIELD

The present invention relates to a light-emitting device, a display device, an electronic device, a lighting device, or a manufacturing method thereof. In particular, the present invention relates to a light-emitting device, a display device, an electronic device, or a lighting device utilizing electroluminescence (EL) or a manufacturing method thereof.

BACKGROUND ART

Recent light-emitting devices and display devices are expected to be applied to a variety of uses and become diversified.

For example, light-emitting devices and display devices for mobile devices and the like are required to be thin, lightweight, and less likely to be broken.

Light-emitting elements utilizing EL (also referred to as EL elements) have features such as ease of thinning and lightening, high-speed response to input signal, and driving with a direct-current low voltage source; therefore, application of the light-emitting elements to light-emitting devices and display devices has been proposed.

For example, Patent Document 1 discloses a flexible active matrix light-emitting device in which an organic EL element and a transistor serving as a switching element are provided over a film substrate.

Reference

[Patent Document]
[Patent Document 1] Japanese Published Patent Application No. 2003-174153

DISCLOSURE OF INVENTION

For example, a display device that is reduced in size for high portability to have a small display region can display less information on one screen and is less browsable.

An object of one embodiment of the present invention is to provide a highly portable light-emitting device, display device, electronic device, or lighting device. Another object of one embodiment of the present invention is to provide a highly browsable light-emitting device, display device, or electronic device. Another object of one embodiment of the present invention is to provide a highly portable and highly browsable light-emitting device, display device, or electronic device.

An object of one embodiment of the present invention is to provide a novel light-emitting device, display device, electronic device, or lighting device. Another object of one embodiment of the present invention is to provide a lightweight light-emitting device, display device, electronic device, or lighting device. Another object of one embodiment of the present invention is to provide a highly reliable light-emitting device, display device, electronic device, or lighting device. Another object of one embodiment of the present invention is to provide a light-emitting device, display device, electronic device, or lighting device that is less likely to be broken. Another object of one embodiment of the present invention is to provide a thin light-emitting device, display device, electronic device, or lighting device. Another object of one embodiment of the present invention is to provide a flexible light-emitting device, display device, electronic device, or lighting device. Another object of one embodiment of the present invention is to provide a light-emitting device or lighting device with a seamless large light-emitting region or a display device or electronic device with a seamless large display region. Another object of one embodiment of the present invention is to provide a light-emitting device, display device, electronic device, or lighting device with low power consumption.

In one embodiment of the present invention, there is no need to achieve all the objects.

A light-emitting device of one embodiment of the present invention includes a strip-like high flexibility region and a strip-like low flexibility region that are arranged alternately. The light-emitting device can be folded by bending the high flexibility region. A light-emitting device of one embodiment of the present invention is highly portable in a folded state, and is highly browsable in an opened state because of a seamless large light-emitting region. With one embodiment of the present invention, the portability of a device can be increased without a decrease in the size of a light-emitting region or a display region.

Specifically, one embodiment of the present invention is a light-emitting device including a flexible light-emitting panel and a plurality of support panels that are apart from each other and support the light-emitting panel. The support panel has a lower flexibility than that of the light-emitting panel.

One embodiment of the present invention is a light-emitting device including a strip-like high flexibility region and a strip-like low flexibility region arranged alternately in a first direction. The high flexibility region includes a flexible light-emitting panel. The low flexibility region includes the light-emitting panel and a support panel having a lower flexibility than that of the light-emitting panel and overlapping with the light-emitting panel.

It is preferable that the above light-emitting device further include a protective layer having a higher flexibility than that of the support panel, and that the high flexibility region and the low flexibility region include the light-emitting panel and the protective layer overlapping with the light-emitting panel.

Another embodiment of the present invention is a light-emitting device including a strip-like high flexibility region and a strip-like low flexibility region arranged alternately in a first direction. The high flexibility region includes a flexible light-emitting panel. The low flexibility region includes a support panel having a lower flexibility than that of the light-emitting panel and the light-emitting panel held by the support panel.

It is preferable that the above light-emitting device further include a pair of protective layers and that the protective layer have a higher flexibility than that of the support panel. It is also preferable that in the low flexibility region, the pair of protective layers be held by the support panel and the light-emitting panel be placed between the pair of protective layers.

Another embodiment of the present invention is a light-emitting device including a strip-like high flexibility region and a strip-like low flexibility region arranged alternately in a first direction. The high flexibility region includes a flexible light-emitting panel. The low flexibility region includes a pair of support panels and the light-emitting panel between the pair of support panels. The support panel has a lower flexibility than that of the light-emitting panel.

It is preferable that the above light-emitting device further include a pair of protective layers and that the protective layer have a higher flexibility than that of the support panel It is also preferable that in the low flexibility region, the pair of protective layers be placed between the pair of support panels and the light-emitting panel be placed between the pair of protective layers.

In any of the above light-emitting devices, it is preferable that when one of two adjacent high flexibility regions is bent inward and the other is bent outward, a circle whose radius is a curvature radius of the light-emitting panel in the one high flexibility region and a circle whose radius is a curvature radius of the light-emitting panel in the other high flexibility region overlap with each other by being moved in a direction parallel to a support plane of the light-emitting device.

Note that in this specification, being "bent inward" means being bent such that a light-emitting surface of a light-emitting panel faces inward, and being "bent outward" means being bent such that a light-emitting surface of a light-emitting panel faces outward. A light-emitting surface of a light-emitting panel or a light-emitting device refers to a surface through which light emitted from a light-emitting element is extracted.

In any of the above light-emitting devices, it is preferable that when a plurality of high flexibility regions are bent inward and outward alternately, the shortest distance L between a surface of the light-emitting panel that is closest to a support plane of the light-emitting device and a surface of the light-emitting panel that is farthest from the support plane satisfy $L<2(D+T)$. Here, D represents the sum of curvature radii of the light-emitting panel in the plurality of high flexibility regions and T represents a thickness of the light-emitting panel.

In any of the above light-emitting devices, it is preferable that the light-emitting panel include an external connection electrode and that a length in the first direction of a low flexibility region A that overlaps with the external connection electrode be longer than a length in the first direction of a low flexibility region B that is closest to the region A.

In the above light-emitting device, it is preferable that among the region A, the region B, and a low flexibility region C that is farthest from the region A, a length in the first direction of the region A be the longest and a length in the first direction of the region C be the second longest.

In the above light-emitting devices, it is preferable that among a plurality of low flexibility regions, a length in the first direction of the region A be the longest.

Embodiments of the present invention also include an electronic device including the above light-emitting device and a lighting device including the above light-emitting device. In addition, the above light-emitting device itself functions as an electronic device or a lighting device in some cases.

Note that the light-emitting device in this specification includes, in its category, a display device using a light-emitting element. Further, the category of the light-emitting device in this specification includes a module in which a light-emitting element is provided with a connector such as an anisotropic conductive film or a TCP (tape carrier package); a module having a TCP at the tip of which a printed wiring board is provided; and a module in which an IC (integrated circuit) is directly mounted on a light-emitting element by a COG (chip on glass) method. Furthermore, the category includes a light-emitting device which is used in lighting equipment or the like.

In one embodiment of the present invention, a highly portable light-emitting device, display device, electronic device, or lighting device can be provided. In one embodiment of the present invention, a highly browsable light-emitting device, display device, or electronic device can be provided. In one embodiment of the present invention, a highly portable and highly browsable light-emitting device, display device, or electronic device can be provided.

In one embodiment of the present invention, a novel light-emitting device, display device, electronic device, or lighting device can be provided. In one embodiment of the present invention, a lightweight light-emitting device, display device, electronic device, or lighting device can be provided. In one embodiment of the present invention, a highly reliable light-emitting device, display device, electronic device, or lighting device can be provided. In one embodiment of the present invention, a light-emitting device, display device, electronic device, or lighting device that is less likely to be broken can be provided. In one embodiment of the present invention, a thin light-emitting device, display device, electronic device, or lighting device can be provided. In one embodiment of the present invention, a flexible light-emitting device, display device, electronic device, or lighting device can be provided. In one embodiment of the present invention, a light-emitting device or lighting device with a seamless large light-emitting region or a display device or electronic device with a seamless large display region can be provided. In one embodiment of the present invention, a light-emitting device, display device, electronic device, or lighting device with low power consumption can be provided.

BEST MODE FOR CARRYING OUT THE INVENTION

Figure 1A:
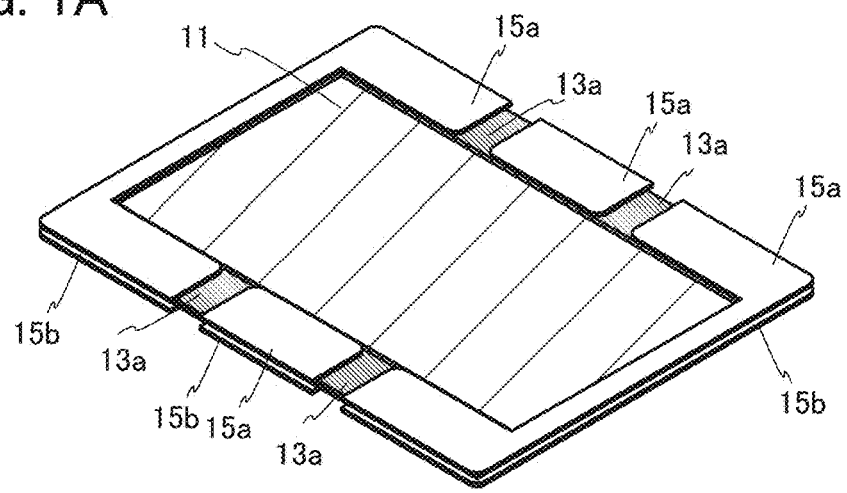
FIGS. 1A to 1C illustrate a light-emitting device.

Embodiments will be described in detail with reference to drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

In addition, the position, size, range, or the like of each structure illustrated in drawings and the like is not accurately represented in some cases for easy understanding. Therefore, the disclosed invention is not necessarily limited to the position, the size, the range, or the like disclosed in the drawings and the like.

Embodiment 1

In this embodiment, light-emitting devices of embodiments of the present invention will be described.

A light-emitting device of one embodiment of the present invention includes a strip-like high flexibility region and a strip-like low flexibility region that are arranged alternately. The light-emitting device can be folded by bending the high flexibility region. A light-emitting device of one embodiment of the present invention is highly portable in a folded state, and is highly browsable in an opened state because of a seamless large light-emitting region.

In the light-emitting device of one embodiment of the present invention, the high flexibility region can be bent either inward or outward.

When the light-emitting device of one embodiment of the present invention is not in use, it can be folded such that a light-emitting surface of a light-emitting panel faces inward, whereby the light-emitting surface can be prevented from being damaged or contaminated.

When the light-emitting device of one embodiment of the present invention is in use, it can be opened so that the seamless large light-emitting region is entirely used, or it can be folded such that the light-emitting surface of the light-emitting panel faces outward and the light-emitting region can be partly used. Folding the light-emitting device and putting part of the light-emitting region that is hidden from a user in a non-light-emitting region can reduce the power consumption of the light-emitting device.

A light-emitting device that can be folded in three parts and includes two strip-like high flexibility regions and three strip-like low flexibility regions is described below as an example.

Figure 1B:
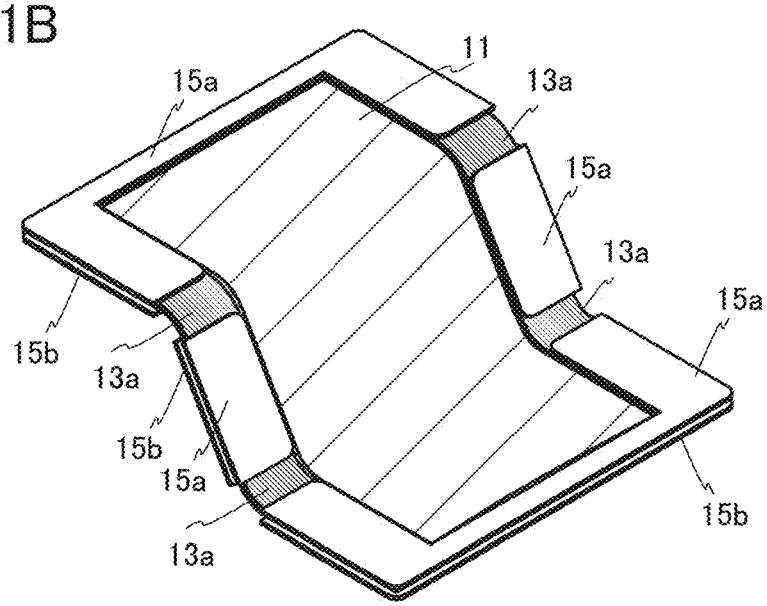
Figure 1C:
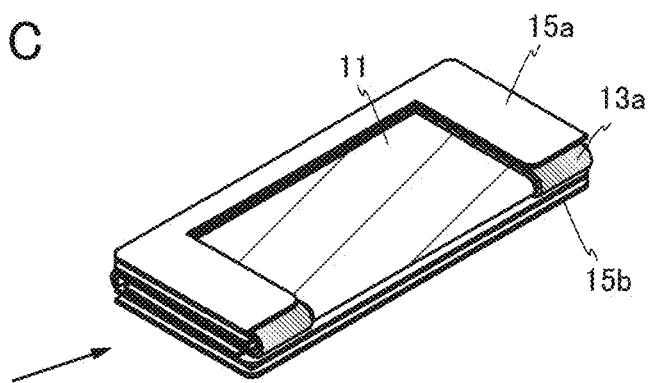
Figure 2:
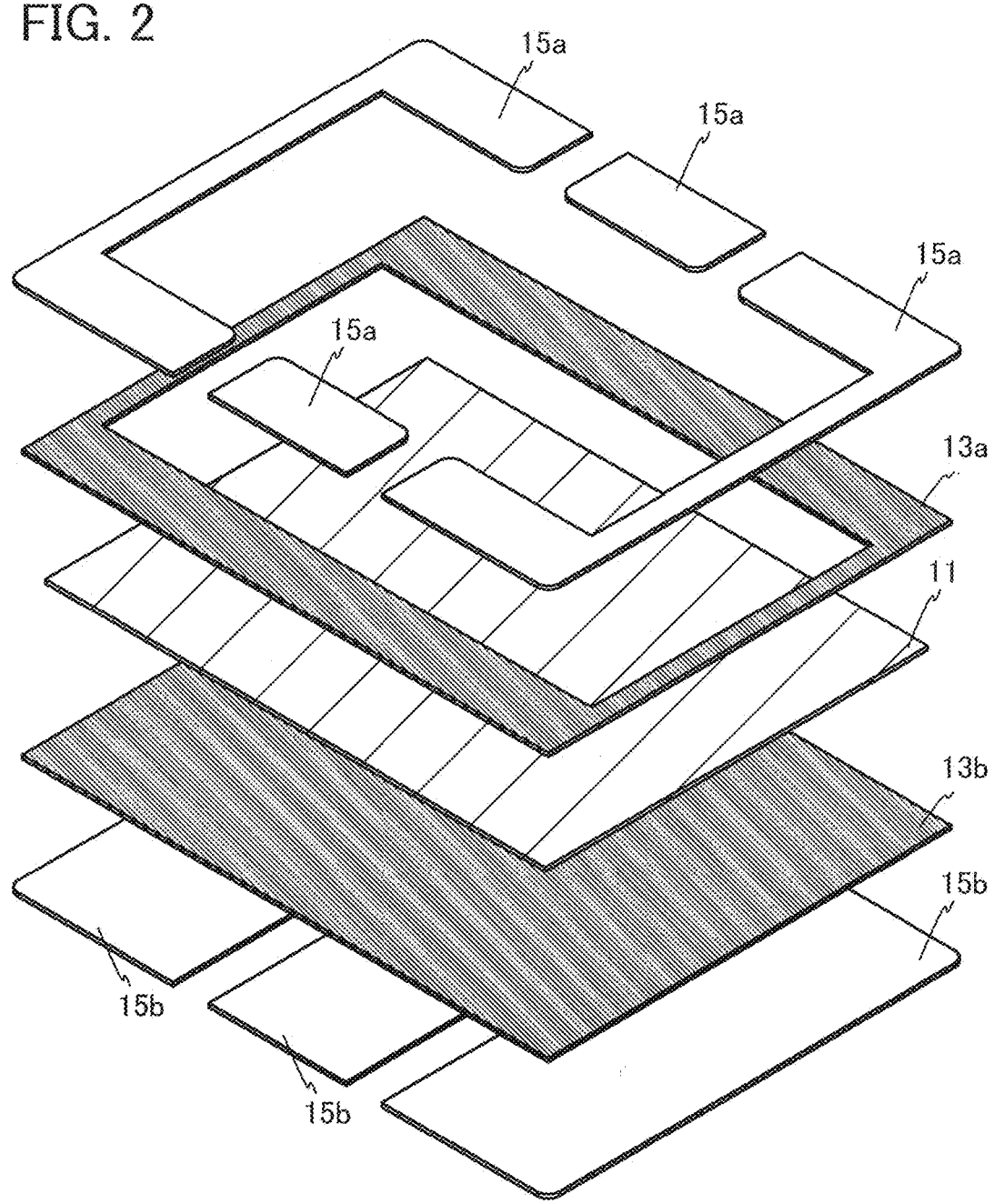
FIG. 2 illustrates a light-emitting device.
Figure 3A:
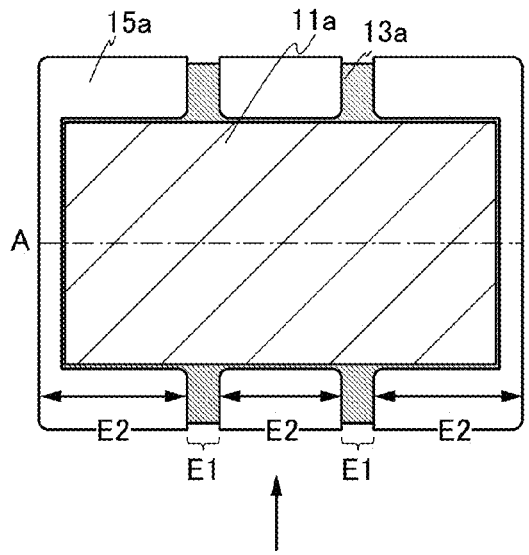
FIGS. 3A to 3F illustrate light-emitting devices.
Figure 3B:
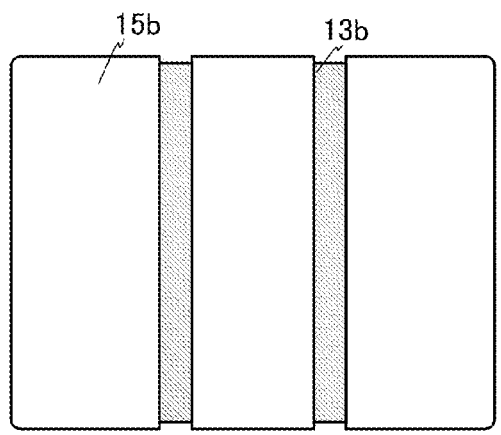
Figure 3C:
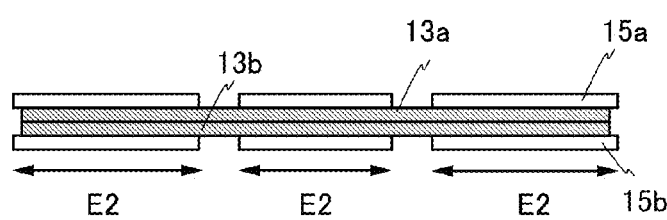
Figure 3D:
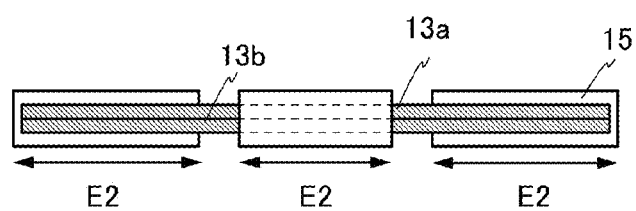
Figure 3E:
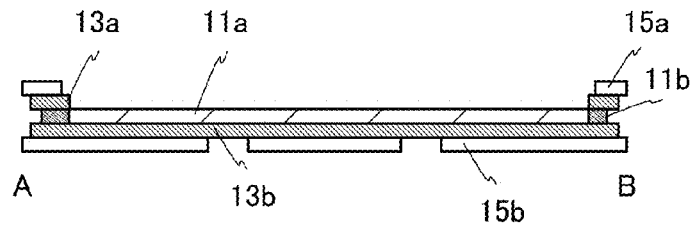
Figure 3F:
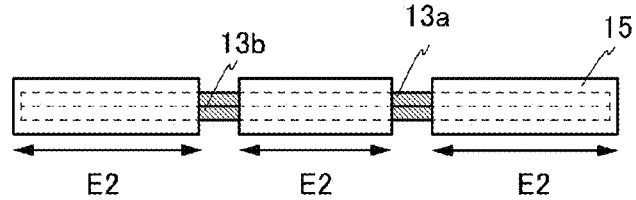
Figure 4A:
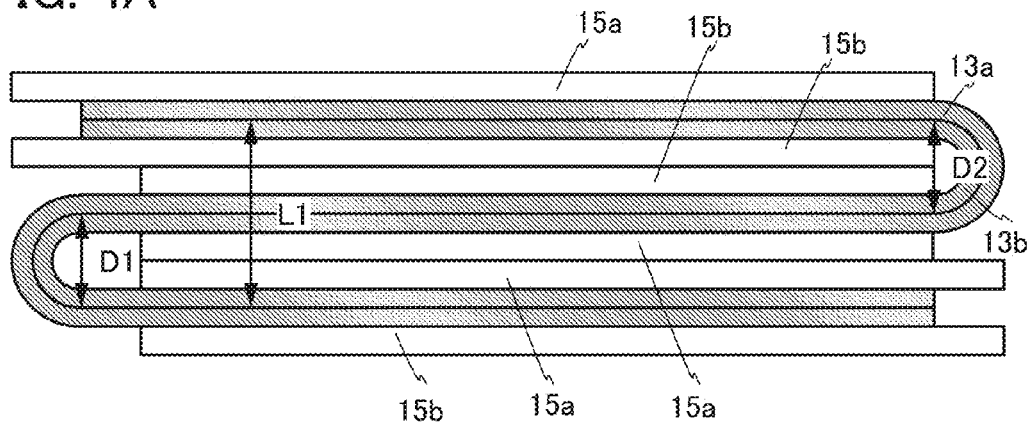
FIGS. 4A to 4D illustrate light-emitting devices.
Figure 4B:
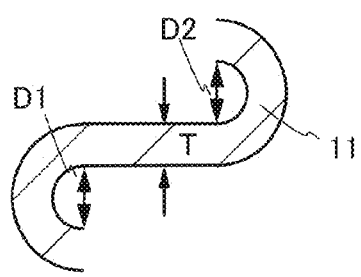
Figure 4C:
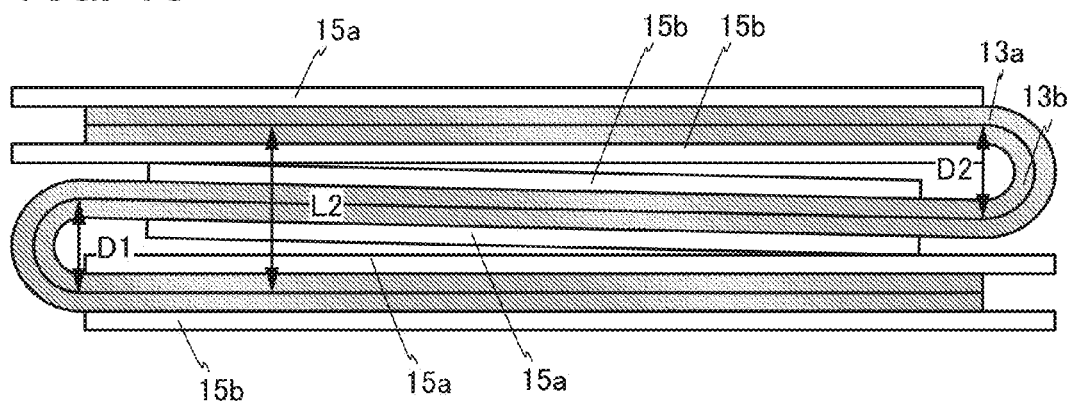
Figure 4D:
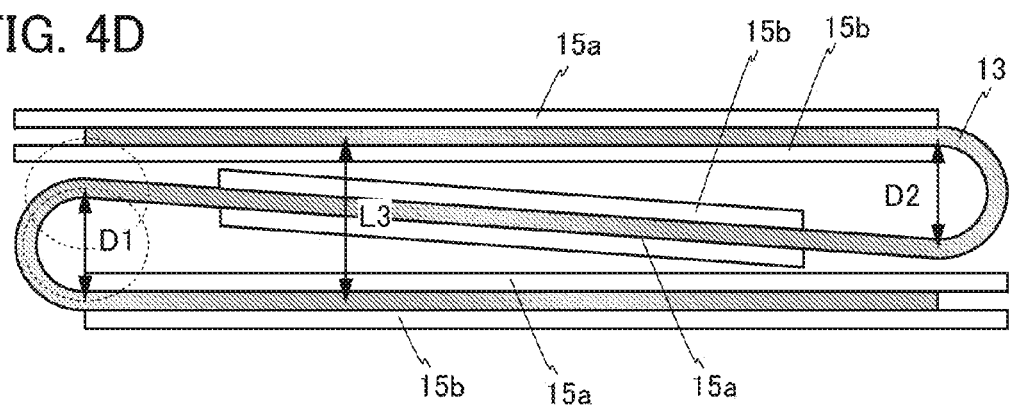

FIG. 1A illustrates the light-emitting device that is opened. FIG. 1B illustrates the light-emitting device that is being opened or being folded. FIG. 1C illustrates the light-emitting device that is folded. FIG. 2 is a perspective view illustrating components of the light-emitting device. FIG. 3A is a plan view of the light-emitting surface side of the light-emitting device, and FIG. 3B is a plan view of the side opposite to the light-emitting surface side of the light-emitting device. FIGS. 3C, 3D, and 3F are examples of a side view of the light-emitting device in FIG. 3A that is viewed in the direction indicated by an arrow. FIG. 3E is a cross-sectional view taken along dashed-dotted line A-B in FIG. 3A. FIGS. 4A, 4C, and 4D are examples of a side view of the light-emitting device in FIG. 1C that is viewed in the direction indicated by an arrow.

Figure 14A:
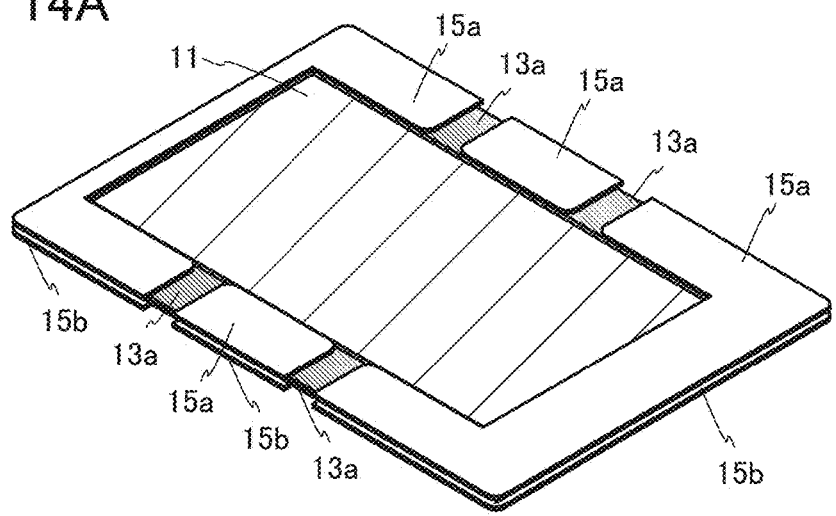
FIGS. 14A to 14C illustrate a light-emitting device.
Figure 14B:
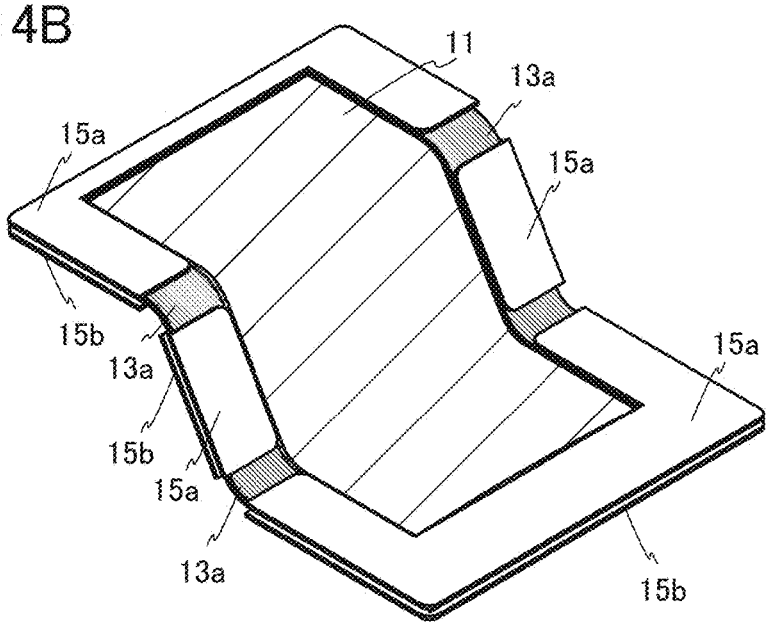
Figure 14C:
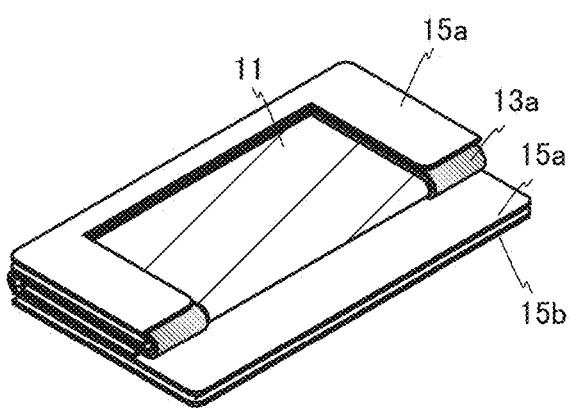
Figure 15:
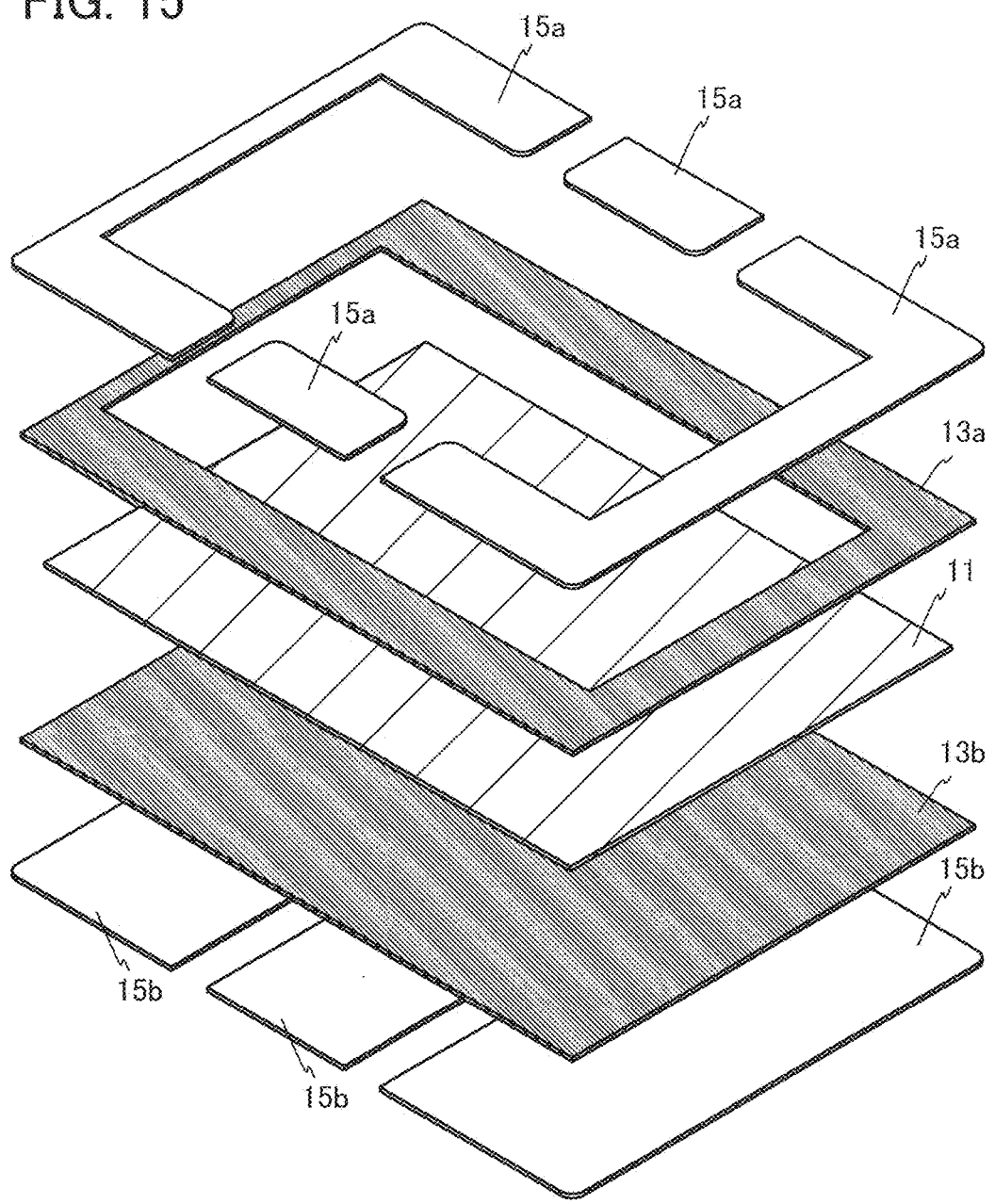
FIG. 15 illustrates a light-emitting device.
Figure 16A:
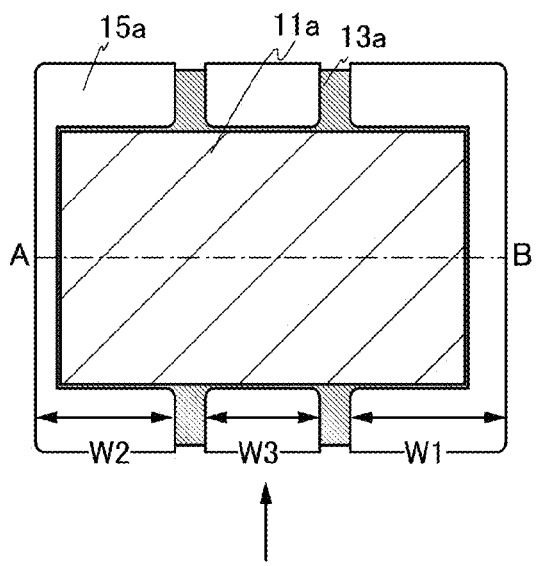
FIGS. 16A to 16F illustrate light-emitting devices.
Figure 16B:
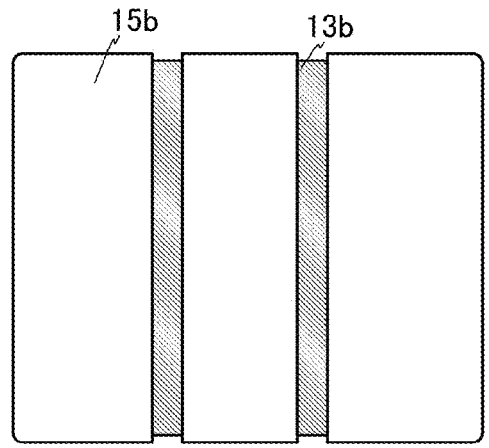
Figure 16C:
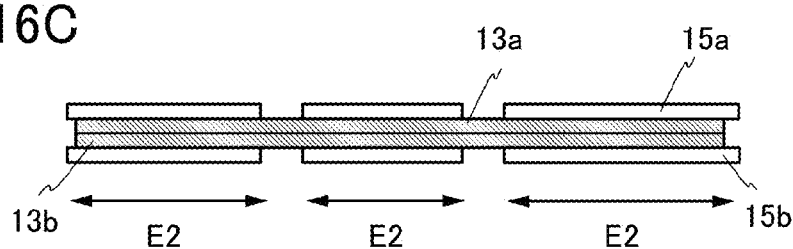
Figure 16D:
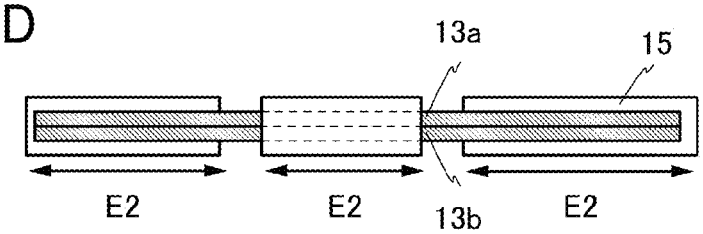
Figure 16E:
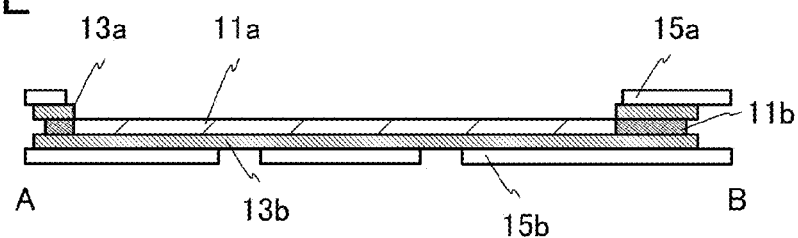
Figure 16F:
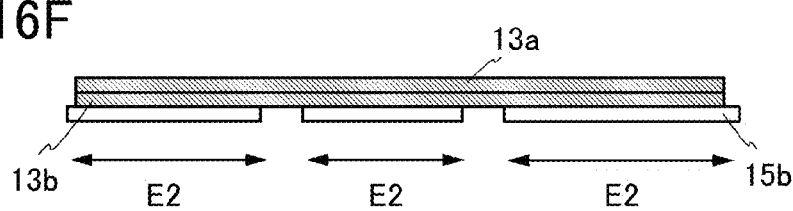

FIG. 14A, FIG. 14B, and FIG. 14C show variations of FIG. 1A, FIG. 1B, and FIG. 1C, respectively. FIG. 14A illustrates the light-emitting device that is opened. FIG. 14B illustrates the light-emitting device that is being opened or being folded. FIG. 14C illustrates the light-emitting device that is folded. FIG. 15 is a perspective view illustrating components of the light-emitting device. FIG. 16A is a plan view of the light-emitting surface side of the light-emitting device, and FIG. 16B is a plan view of the side opposite to the light-emitting surface side of the light-emitting device. FIGS. 16C and 16D are examples of a side view of the light-emitting device in FIG. 16A that is viewed in the direction indicated by an arrow. FIG. 16E is a cross-sectional view taken along dashed-dotted line A-B in FIG. 16A. FIG. 16F shows a variation of the light-emitting device shown in FIG. 16C and the like.

The light-emitting device in FIGS. 1A to 1C and the light-emitting device in FIGS. 14A to 14C each include a flexible light-emitting panel 11, a plurality of support panels 15a, and a plurality of support panels 15b. Each of the support panels 15a and 15b has a lower flexibility than that of the light-emitting panel 11. The plurality of support panels 15a are apart from each other. The plurality of support panels 15b are apart from each other.

As shown in FIG. 3A, the light-emitting device includes high flexibility regions E1 and low flexibility regions E2 that are arranged alternately. The high flexibility region and the low flexibility region are strip-like regions (form stripes). In this embodiment, a plurality of high flexibility regions and a plurality of low flexibility regions are parallel to each other; however, the regions are not necessarily arranged parallel to each other.

The high flexibility region E1 in the light-emitting device includes at least a flexible light-emitting panel. A light-emitting panel using organic EL elements is particularly preferable because it not only has high flexibility and impact resistance but also can be thinned and lightened. Examples of a structure of a light-emitting panel are detailed in Embodiments 2 and 3.

The low flexibility region E2 in the light-emitting device includes at least a flexible light-emitting panel and a support panel having a lower flexibility than that of the light-emitting panel and overlapping with the light-emitting panel.

As shown in FIG. 16A, the light-emitting device includes a high flexibility region and a low flexibility region that are arranged alternately in one direction.

In FIG. 16A, W1 to W3 represent the lengths of the low flexibility regions in the direction in which the high flexibility region and the low flexibility region are arranged.

In addition, the low flexibility region preferably includes an external connection electrode of the light-emitting panel. Here, the external connection electrode corresponds to, for example, a conductive layer 157 in FIG. 7B.

In FIG. 16A, the low flexibility region with the length W1 includes the external connection electrode. In the light-emitting device, the length W1 of a low flexibility region A overlapping with the external connection electrode is longer than the length W3 of a low flexibility region B that is closer to the region A.

Here, when an end portion (also referred to as a folded portion or the like) of the light-emitting panel 11 is positioned on the outer side than end portions of the support panels 15a and 15b in the light-emitting device in a folded state, the light-emitting panel 11 is damaged or an element included in the light-emitting panel 11 is broken in some cases.

In light-emitting device in a folded state shown in FIG. 1C, the end portion of the light-emitting panel 11 is aligned with the end portions of the support panels 15a and 15b over and below the light-emitting panel 11. This structure can prevent damage to the light-emitting panel 11, breakage of an element included in the light-emitting panel 11, and the like.

Moreover, in the light-emitting device in a folded state shown in FIG. 14C, the end portion of the light-emitting panel 11 is positioned on the inner side than the end portions of the support panels 15a and 15b. This structure can further prevent damage to the light-emitting panel 11, breakage of an element included in the light-emitting panel 11, and the like.

Accordingly, in the light-emitting device, it is preferable that the length W1 of the low flexibility region A overlapping with the external connection electrode be longer than the length W3 of the low flexibility region B that is closer to the region A. It is particularly preferable that, among the length W1 of the region A, the length W3 of the region B, and the length W2 of a low flexibility region C that is farther from the region A, W1 be the longest and W2 be the second longest.

The support panel is provided on at least one of the light-emitting surface side and the side opposite to the light-emitting surface side of the light-emitting panel.

The light-emitting panel preferably has support panels on both the light-emitting surface side and the side opposite to the light-emitting surface side, like the support panels 15a and 15b shown in FIG. 3C or FIG. 16C, in which case the light-emitting panel can be sandwiched between a pair of support panels; thus, the mechanical strength of the low flexibility region is increased and the light-emitting device becomes less likely to be broken.

Alternatively, a support panel 15 shown in FIG. 3D or FIG. 16D may be used instead of the support panels 15a and 15b and the light-emitting panel 11 may be held by the support panel 15.

Figure 21A:
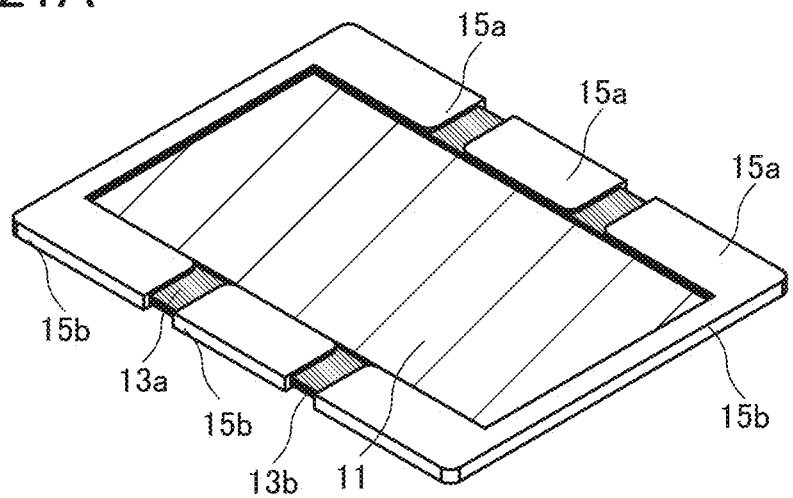
FIGS. 21A to 21C illustrate a light-emitting device.
Figure 21B:
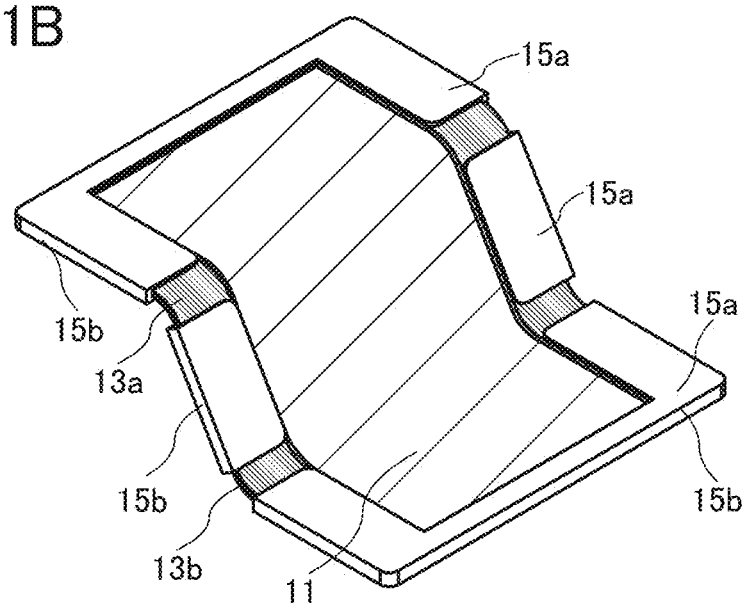
Figure 21C:
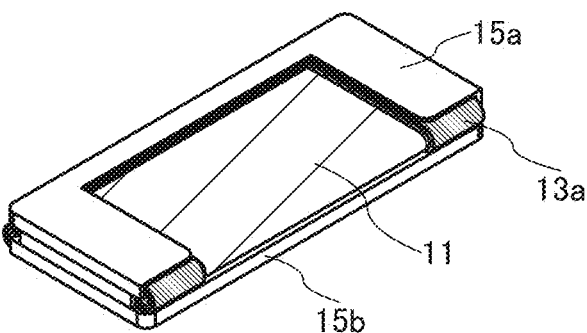
Figure 22:
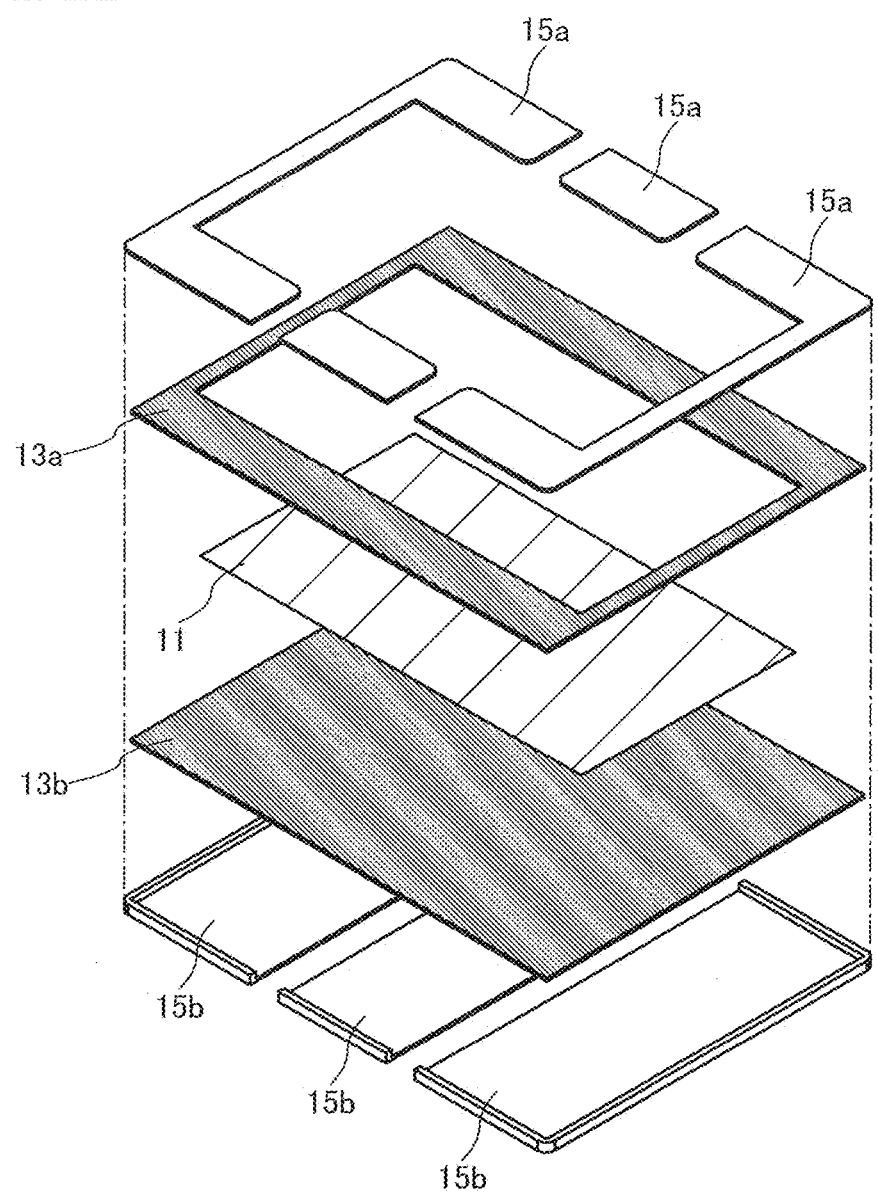
FIG. 22 illustrates a light-emitting device.

In FIG. 1A, FIG. 2, and FIG. 3C, for example, side surfaces of a protective layer and the light-emitting panel are exposed in the low flexibility region E2; however, one embodiment of the present invention is not limited thereto. As shown in FIG. 3F, side surfaces of the protective layer and the light-emitting panel may be covered with the support panel 15 (or one or both of the pair of support panels 15a and 15b) in the low flexibility region E2. FIGS. 21A to 21C illustrate a specific structure of a light-emitting device in which side surfaces of the protective layer and the light-emitting panel are covered with the support panel 15b. FIG. 21A illustrates the light-emitting device that is opened. FIG. 21B illustrates the light-emitting device that is being opened or being folded. FIG. 21C illustrates the light-emitting device that is folded. FIG. 22 is a perspective view illustrating components of the light-emitting device.

It is preferable that the light-emitting panel have the support panel on only one of the light-emitting surface side and the side opposite to the light-emitting surface side because the light-emitting device can be thinner or more lightweight. For example, as shown in FIG. 16F, a light-emitting device that includes the plurality of support panels 15b and does not include the plurality of support panels 15a may be employed.

The high flexibility region E1 and the low flexibility region E2 preferably include the light-emitting panel and a protective layer having a higher flexibility than that of the support panel and overlapping with the light-emitting panel. In that case, the high flexibility region E1 in the light-emitting device can have high mechanical strength as well as flexibility and the light-emitting device becomes less likely to be broken. This structure makes the light-emitting device less likely to be broken by deformation due to external force or the like in the high flexibility region as well as the low flexibility region.

For example, it is preferable that the support panel be the thickest and the light-emitting panel be the thinnest among the light-emitting panel, the support panel, and the protective layer. Alternatively, for example, it is preferable that the support panel have the lowest flexibility and the light-emitting panel have the highest flexibility among the light-emitting panel, the support panel, and the protective layer. Such a structure increases the difference in flexibility between the high flexibility region and the low flexibility region. Thus, the light-emitting device can be folded reliably at the high flexibility region, so that the low flexibility region is prevented from being bent. Consequently, the reliability of the light-emitting device can be improved. Such a structure also prevents the light-emitting device from being bent at an undesired portion.

The light-emitting panel preferably has protective layers on both the light-emitting surface side and the side opposite to the light-emitting surface side, in which case the light-emitting panel can be sandwiched between a pair of protective layers; thus, the light-emitting device has increased mechanical strength and becomes less likely to be broken.

For example, as shown in FIG. 3C or FIG. 16C, in the low flexibility region E2, it is preferable that a pair of protective layers 13a and 13b be placed between the pair of support panels 15a and 15b and the light-emitting panel (hot shown) be placed between the pair of protective layers 13a and 13b.

Alternatively, as shown in FIG. 3D or FIG. 16D, in the low flexibility region E2, it is preferable that the pair of protective layers 13a and 13b be held by the support panel 15 and the light-emitting panel (not shown) be placed between the pair of protective layers 13a and 13b.

It is preferable that the light-emitting panel have the protective layer on only one of the light-emitting surface side and the side opposite to the light-emitting surface side because the light-emitting device can be thinner or more lightweight. For example, a light-emitting device that includes the protective layer 13b and does not include the protective layer 13a may be employed.

When the protective layer 13a on the light-emitting surface side of the light-emitting panel is a light-blocking film, a non-light-emitting region of the light-emitting panel can be prevented from being irradiated with external light. This structure is preferable because it prevents photodegradation of a transistor and the like of a driver circuit that is included in the non-light-emitting region.

As shown in FIG. 2, FIG. 3E, FIG. 15, or FIG. 16E, an opening in the protective layer 13a provided on the light-emitting surface side of the light-emitting panel 11 overlaps with a light-emitting region 11a of the light-emitting panel. The protective layer 13a overlaps with a non-light-emitting region 11b that surrounds the light-emitting region 11a like a frame. The protective layer 13b provided on the side opposite to the light-emitting surface side of the light-emitting panel 11 overlaps with the light-emitting region 11a and the non-light-emitting region 11b. The protective layer 13b is provided in a large region, preferably on the entire surface on the side opposite to the light-emitting surface side to strongly protect the light-emitting panel; thus, the reliability of the light-emitting device can be improved.

In the light-emitting device of one embodiment of the present invention, it is preferable that when a plurality of high flexibility regions are bent inward and outward alternately, the shortest distance L between a surface of the light-emitting panel that is closest to a support plane of the light-emitting device and a surface of the light-emitting panel that is farthest from the support plane satisfy $L<2(D+T)$. Here, D represents the sum of curvature radii of the light-emitting panel in the plurality of high flexibility regions and T represents a thickness of the light-emitting panel. In that case, the light-emitting device can be made thinner.

The light-emitting device shown in FIG. 4A is in a state where one high flexibility region is bent inward and one high flexibility region is bent outward. The light-emitting panel is placed at the boundary between the protective layer 13a and the protective layer 13b in FIG. 4A. A diameter D1 and a diameter D2 in FIG. 4A are described in detail with reference to FIG. 4B. D1 represents a diameter of a circle whose radius is the curvature radius of the light-emitting panel in the high flexibility region that is bent inward. D2 represents a diameter of a circle whose radius is the curvature radius of the light-emitting panel in the high flexibility region that is bent outward. T represents the thickness of the light-emitting panel 11. Since the sum of the diameter D1 and the diameter D2 corresponds to twice the sum D of the curvature radii of the light-emitting panel in the plurality of high flexibility regions, L<2(D+T) corresponds to L<D1+D2+2T. Here, the shortest distance L1 between a surface that is closest to a support plane of the light-emitting device and a surface that is farthest from the support plane of the light-emitting panel in FIG. 4A is represented by D1+D2+3T.

By reducing the thicknesses of the support panels 15a and 15b or the thicknesses of the protective layers 13a and 13b or narrowing the width of the low flexibility region between the high flexibility region that is bent inward and the high flexibility region that is bent outward, for example, the shortest distance L2 between a surface that is closest to a support plane of the light-emitting device and a surface that is farthest from the support plane of the light-emitting panel in FIG. 4C can satisfy L2<D1+D2+3T or even satisfy L2<D1+D2+2T, i.e., L2<2(D+T).

Here, in the light-emitting device, it is preferable that a pair of low flexibility regions positioned on the outer side among the low flexibility regions that are overlapped by folding the light-emitting device be parallel to the support plane of the light-emitting device, and that a low flexibility region positioned on the inner side not be parallel to the support plane.

In the light-emitting device of one embodiment of the present invention, it is preferable that when one of two adjacent high flexibility regions is bent inward and the other is bent outward, a circle whose radius is a curvature radius of the light-emitting panel in the one high flexibility region and a circle whose radius is a curvature radius of the light-emitting panel in the other high flexibility region overlap with each other by being moved in a direction parallel to a support plane of the light-emitting device. In that case, the light-emitting device can be made thinner.

As shown in FIG. 4D, a circle with the diameter D1 and a circle with the diameter D2 overlap with each other by being moved in a direction parallel to the support plane of the light-emitting device (here, in the horizontal direction in the drawing). The curvature radius of the light-emitting panel in the high flexibility region that is bent inward and the curvature radius of the light-emitting panel in the high flexibility region that is bent outward correspond to the radii of the two circles; accordingly, it can be said that the light-emitting device in FIG. 4D is thin.

The shortest distance L3 between a surface that is closest to a support plane of the light-emitting device and a surface that is farthest from the support plane of the light-emitting panel in FIG. 4D can satisfy L3<D1+D2+3T or even satisfy L3<D1+D2+2T, i.e., L3<2(D+T). Note that in FIG. 4D, the protective layer 13a and the protective layer 13b are collectively shown as a protective layer 13.

The protective layer and the support panel can be formed using plastic, a metal, an alloy, rubber, or the like. Plastic, rubber, or the like is preferably used because it can form a protective layer or a support panel that is lightweight and less likely to be broken. For example, silicone rubber may be used for the protective layer and stainless steel or aluminum may be used for the support panel.

The protective layer and the support panel are preferably formed using a material with high toughness. In that case, a light-emitting device with high impact resistance that is less likely to be broken can be provided. For example, when an organic resin, a thin metal material, or a thin alloy material is used for the protective layer and the support panel, the light-emitting device can be lightweight and less likely to be broken. For a similar reason, also a substrate of the light-emitting panel is preferably formed using a material with high toughness.

The protective layer and the support panel on the light-emitting surface side do not necessarily have a light-transmitting property if they do not overlap with the light-emitting region of the light-emitting panel. When the protective layer and the support panel on the light-emitting surface side overlap with at least part of the light-emitting region, they are preferably formed using a material that transmits light emitted from the light-emitting panel. There is no limitation on the light-transmitting property of the protective layer and the support panel on the side opposite to the light-emitting surface side.

When any two of the protective layer, the support panel, and the light-emitting panel are bonded to each other, any of a variety of adhesives can be used, and for example, a curable resin that is curable at room temperature (e.g., two-component-mixture-type resin), a light curable resin, a thermosetting resin, or the like can be used. Alternatively, a sheet-like adhesive may be used. Alternatively, components of the light-emitting device may be fixed with, for example, a screw that penetrates two or more of the protective layer, the support panel, and the light-emitting panel or a pin or clip that holds them.

The light-emitting device of one embodiment of the present invention can he used with one light-emitting panel (one light-emitting region) divided into two or more regions at a folded portion(s). For example, it is possible to put the region that is hidden by folding the light-emitting device in a non-light-emitting state and put only the exposed region in a light-emitting state, Thus, power consumed by a region that is not used by a user can be reduced.

The light-emitting device of one embodiment of the present invention may include a sensor for determining whether each high flexibility region is bent or not. The sensor can be composed of, for example, a switch, a MEMS pressure sensor, a pressure sensor, or the like.

Figure 5A:
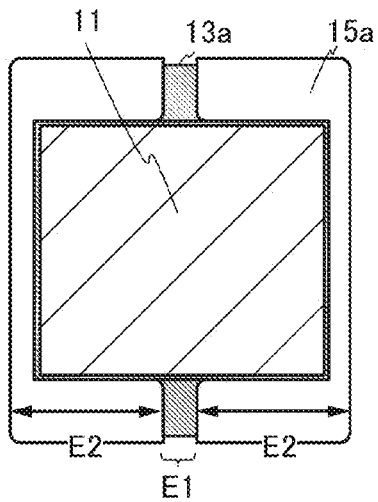
FIGS. 5A to 5D illustrate light-emitting devices.
Figure 5B:
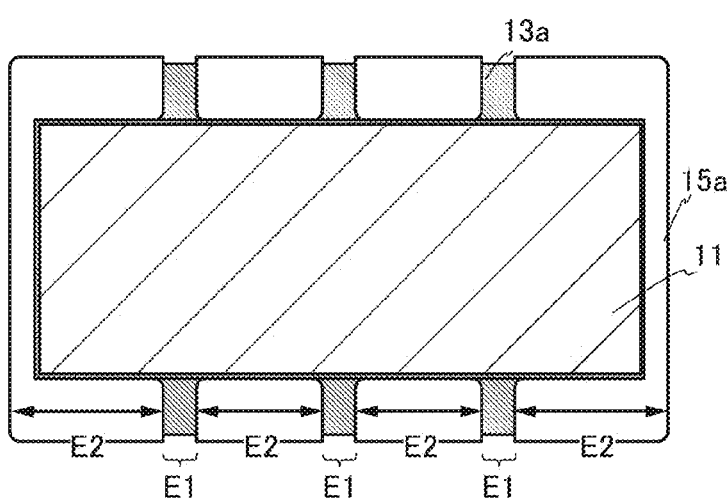

In the examples described above, the light-emitting device includes two high flexibility regions; however, one embodiment of the present invention is not limited thereto. For example, as shown in FIG. 5A, the light-emitting device includes at least one high flexibility region E1. Embodiments of the present invention also include a light-emitting device that includes three high flexibility regions E1 and can be folded in four parts as shown in FIG. 5B or FIG. 17A and a light-emitting device that includes four high flexibility regions E1 and can be folded in five parts as shown in FIG. 5C or FIG. 17B.

Figure 17A:
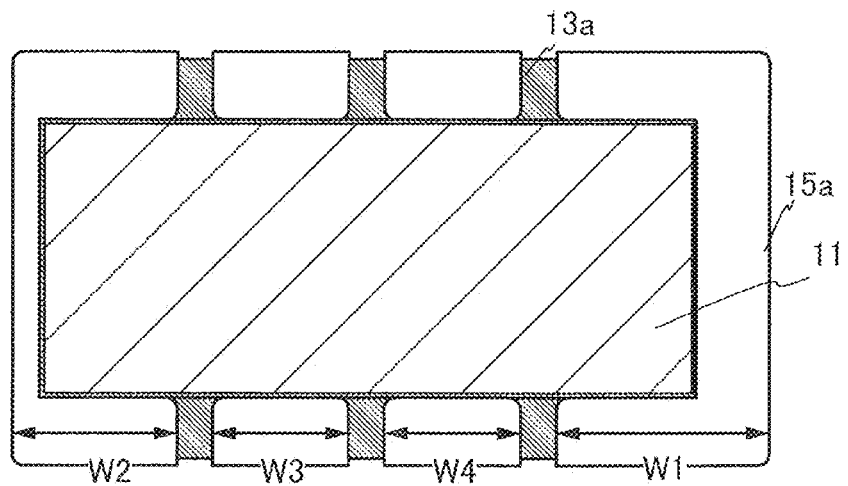
FIGS. 17A and 17B illustrate light-emitting devices.

For example, in the light-emitting device shown in FIG. 17A, W1 is the longest, W2 is the second longest, and W3 and W4 are the shortest among the lengths W1 to W4. The lengths W3 and W4 may be different lengths.

Figure 17B:
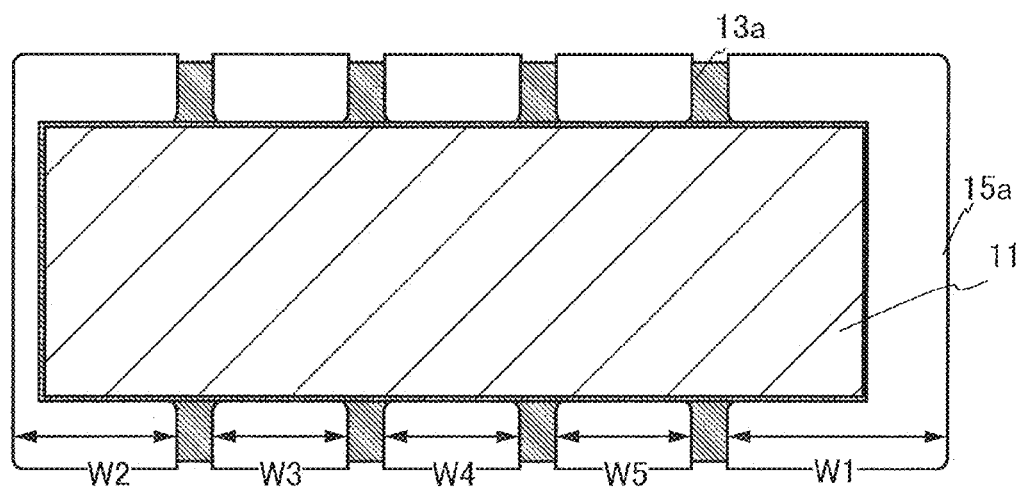

In addition, in the light-emitting device shown in FIG. 17B, W1 is the longest, W2 is the second longest, and W3, W4, and W5 are the shortest among the lengths W1 to W5. The lengths W3, W4, and W5 may be different lengths.

Figure 5C:
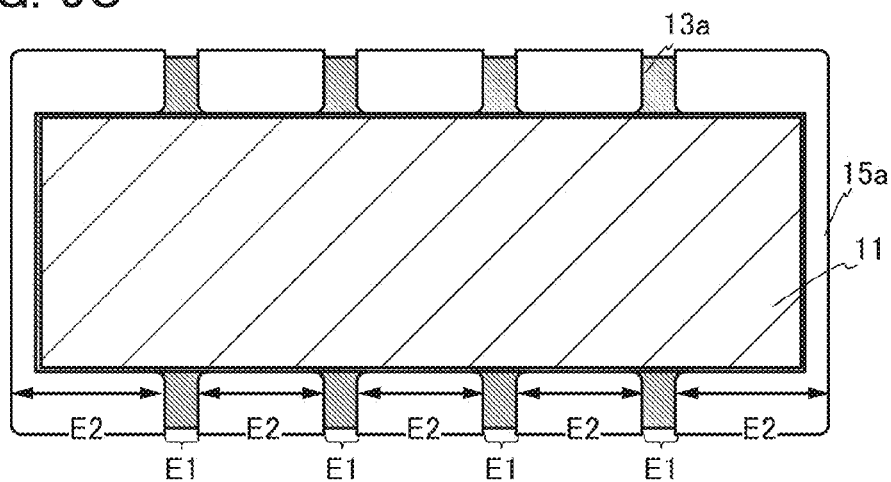
Figure 6A:
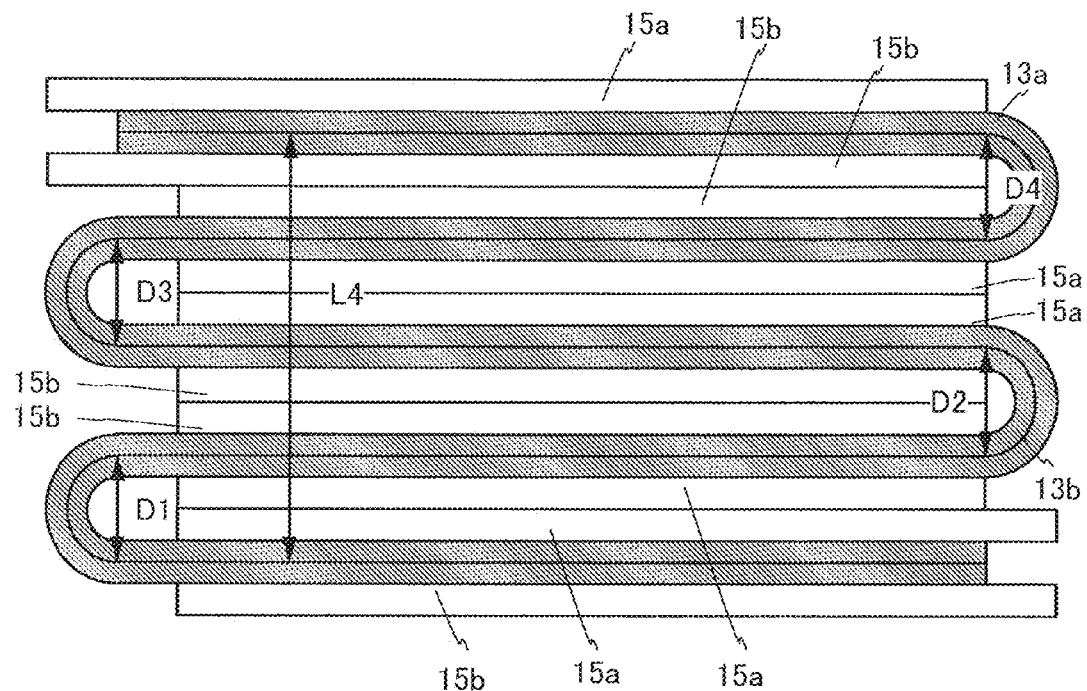
FIGS. 6A and 6B illustrate light-emitting devices.
Figure 6B:
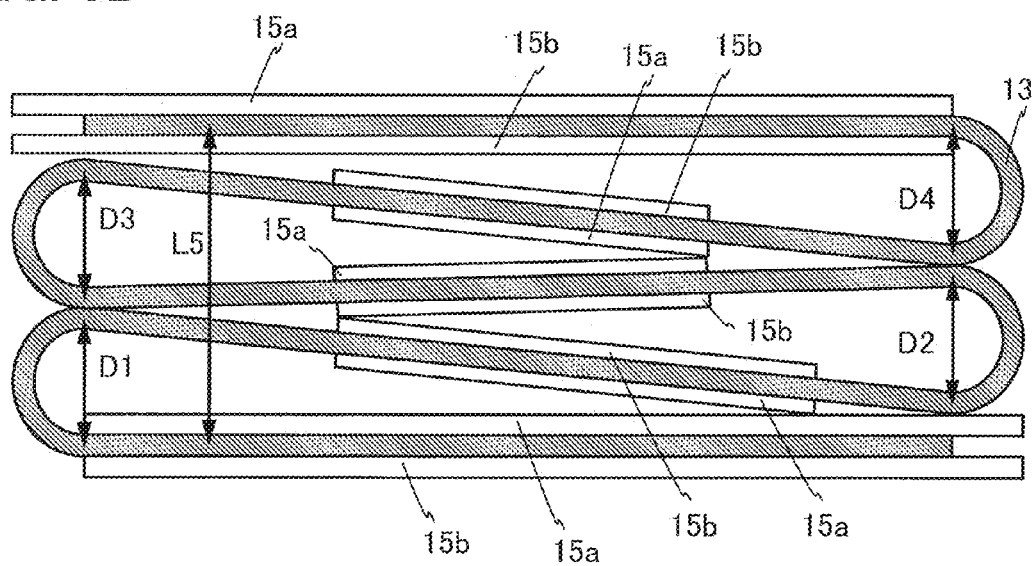

FIGS. 6A and 6B each illustrate an example in which the light-emitting device in FIG. 5C is folded in five parts.

In FIG. 6A, the shortest distance L4 between a surface of the light-emitting panel that is closest to a support plane of the light-emitting device and a surface of the light-emitting panel that is farthest from the support plane is represented by 2D+5T. Here, D represents the sum of the curvature radii of the light-emitting panel in the plurality of high flexibility regions and T represents the thickness of the light-emitting panel. Note that 2D=D1+D2+D3+D4.

By reducing the thicknesses of the support panels 15a and 15b or the thicknesses of the protective layers 13a and 13b or narrowing the width of the low flexibility region between the high flexibility region that is bent inward and the high flexibility region that is bent outward, for example, the shortest distance L5 between a surface of the light-emitting panel in FIG. 6B that is closest to a support plane of the light-emitting device and a surface of the light-emitting panel that is farthest from the support plane can satisfy L5<D1+D2+D3+D4+5T, or even satisfy L5<D1+D2+D3+D4+2T, i.e., L5<2D+2T. Here, D represents the sum of the curvature radii of the light-emitting panel in the plurality of high flexibility regions and T represents the thickness of the light-emitting panel.

In FIG. 6B, a circle with the diameter D1 and a circle with the diameter D2 overlap with each other by being moved in a direction parallel to the support plane of the light-emitting device (here, in the horizontal direction in the drawing). In addition, a circle with the diameter D3 and a circle with the diameter D4 overlap with each other by being moved in a direction parallel to the support plane of the light-emitting device. When one of the two adjacent high flexibility regions is bent inward and the other is bent outward, the radius of the circle with the diameter D1 and the radius of the circle with the diameter D2 correspond to the curvature radius of the light-emitting panel in the high flexibility region that is bent inward and the curvature radius of the light-emitting panel in the high flexibility region that is bent outward; accordingly, it can be said that the light-emitting device in FIG. 6B is thin. This can also be said from the radius of the circle with the diameter D3 and the radius of the circle with the diameter D4.

Moreover, by reducing, as compared with a pair of low flexibility regions on the outermost side of the light-emitting device, the widths of the other low flexibility regions as shown in FIG. 6B, the light-emitting device can be made even thinner.

Figure 5D:
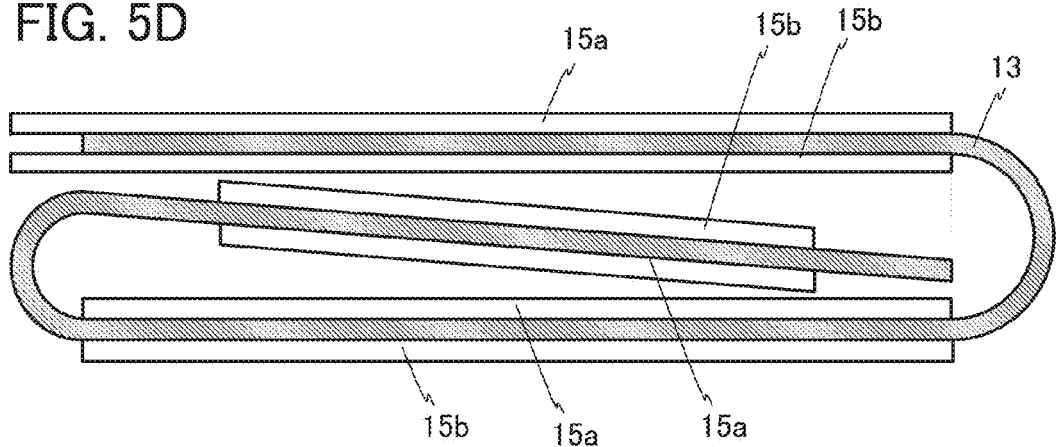

Furthermore, when the light-emitting device is folded, the high flexibility regions are not necessarily bent inward and outward alternately; for example, as shown in FIG. 5D, each high flexibility region may be bent inward. In such a state, when the light-emitting device is carried, for example, the light-emitting surface of the light-emitting device can be prevented from being damaged or contaminated.

In the light-emitting device of this embodiment, one light-emitting panel can be folded once or more times. The curvature radius in that case can be, for example, greater than or equal to 1 mm and less than or equal to 150 mm.

This embodiment can be combined with any other embodiment as appropriate.

Embodiment 2

In this embodiment, light-emitting panels will be described with reference to FIGS. 7A and 7B, FIGS. 8A and 8B, FIGS. 9A and 9B, FIGS. 10A and 10B, FIGS. 11A to 11C, and FIGS. 12A to 12C. When the light-emitting panel described in this embodiment is bent, the minimum curvature radius of a bent portion of the light-emitting panel can be greater than or equal to 1 mm and less than or equal to 150 mm, greater than or equal to 1 mm and less than or equal to 100 mm, greater than or equal to 1 mm and less than or equal to 50 mm, greater than or equal to 1 mm and less than or equal to 10 mm, or greater than or equal to 2 mm and less than or equal to 5 mm. The light-emitting panel in this embodiment is free from breakage of an element even when bent with a small curvature radius (e.g., greater than or equal to 2 mm and less than or equal to 5 mm) and has high reliability. Bending the light-emitting panel with a small curvature radius can make the light-emitting device of one embodiment of the present invention thin. There is no limitation on the direction in which the light-emitting panel in this embodiment is bent. Further, the number of bent portions may be one or more than one.

<Specific Example 1>

Figure 7A:
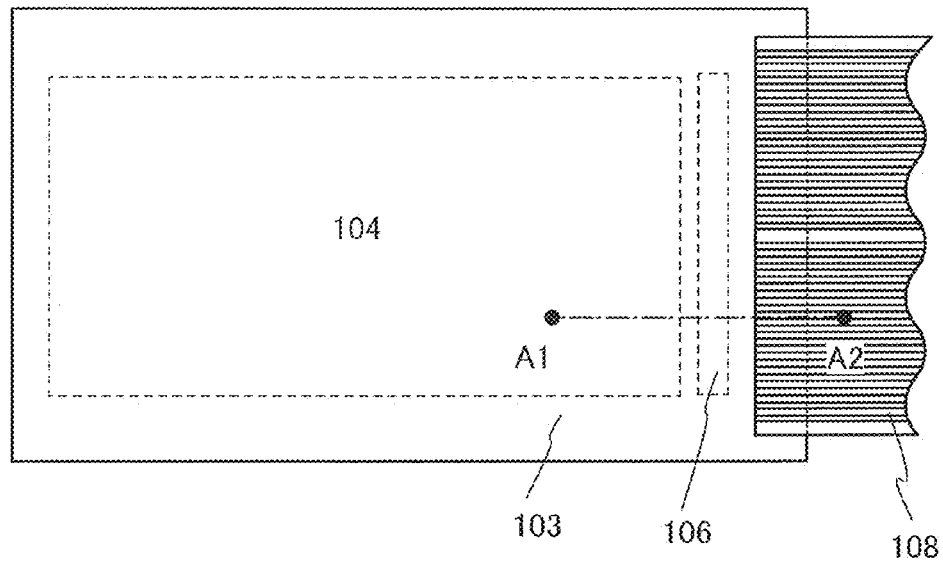
FIGS. 7A and 7B illustrate a light-emitting panel.
Figure 7B:
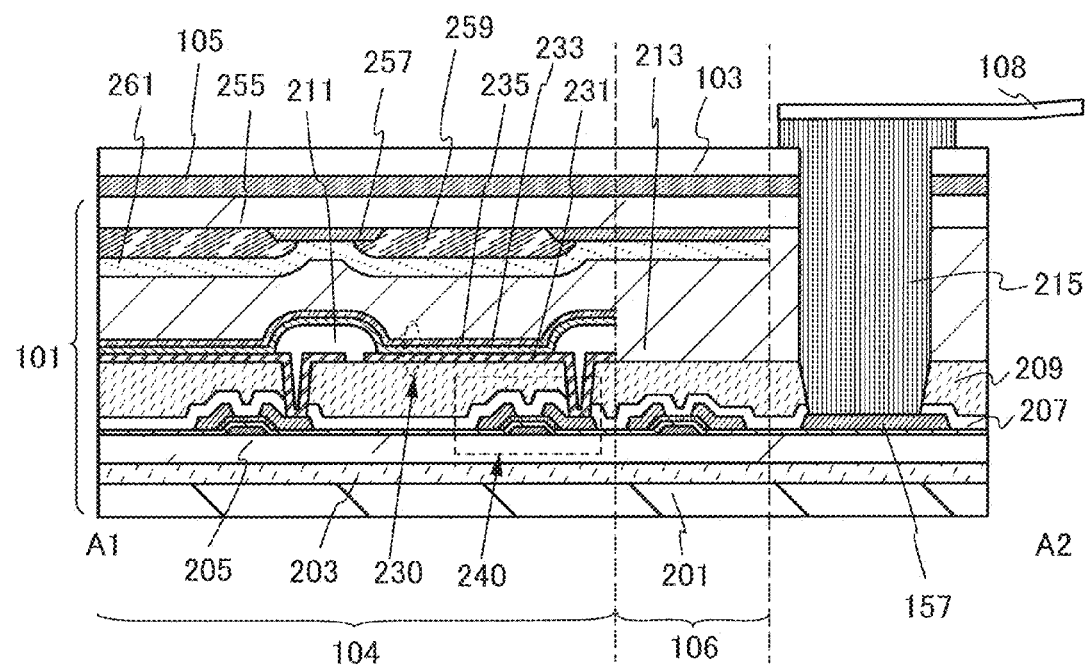

FIG. 7A is a plan view of the light-emitting panel 11 described as an example in Embodiment 1, and FIG. 7B is an example of a cross-sectional view taken along dashed-dotted line A1-A2 in FIG. 7A.

The light-emitting panel shown in FIG. 7B includes an element layer 101, a bonding layer 105, and a substrate 103. The element layer 101 includes a substrate 201, a bonding layer 203, an insulating layer 205, a plurality of transistors, the conductive layer 157, an insulating layer 207, an insulating layer 209, a plurality of light-emitting elements, an insulating layer 211, a sealing layer 213, an insulating layer 261, a coloring layer 259, a light-blocking layer 257, and an insulating layer 255.

The conductive layer 157 is electrically connected to an FPC 108 via connector 215.

A light-emitting element 230 includes a lower electrode 231, an EL layer 233, and an upper electrode 235. The lower electrode 231 is electrically connected to a source electrode or a drain electrode of a transistor 240. An end portion of the lower electrode 231 is covered with the insulating layer 211. The light-emitting element 230 has a top emission structure. The upper electrode 235 has a light-transmitting property and transmits light emitted from the EL layer 233.

The coloring layer 259 is provided to overlap with the light-emitting element 230, and the light-blocking layer 257 is provided to overlap with the insulating layer 211. The coloring layer 259 and the light-blocking layer 257 are covered with the insulating layer 261. The space between the light-emitting element 230 and the insulating layer 261 is filled with the sealing layer 213.

The light-emitting panel includes a plurality of transistors including the transistor 240 in a light extraction portion 104 and a driver circuit portion 106. The transistor 240 is provided over the insulating layer 205. The insulating layer 205 and the substrate 201 are attached to each other with the bonding layer 203. The insulating layer 255 and the substrate 103 are attached to each other with the bonding layer 105. It is preferable to use films with low water permeability for the insulating layer 205 and the insulating layer 255, in which case an impurity such as water can be prevented from entering the light-emitting element 230 or the transistor 240, leading to improved reliability of the light-emitting panel. The bonding layer 203 can be formed using a material similar to that of the bonding layer 105.

The light-emitting panel in Specific Example 1 can be manufactured in the following manner: the insulating layer 205, the transistor 240, and the light-emitting element 230 are formed over a formation substrate with high heat resistance; the formation substrate is separated; and the insulating layer 205, the transistor 240, and the light-emitting element 230 are transferred to the substrate 201 and attached thereto with the bonding layer 203. The light-emitting panel in Specific Example 1 can be manufactured in the following manner: the insulating layer 255, the coloring layer 259, and the light-blocking layer 257 are formed over a formation substrate with high heat resistance; the formation substrate is separated; and the insulating layer 255, the coloring layer 259, and the light-blocking layer 257 are transferred to the substrate 103 and attached thereto with the bonding layer 105.

In the case where a material with low heat resistance (e.g., resin) is used for a substrate, it is difficult to expose the substrate to high temperature in the manufacturing process. Thus, there is a limitation on conditions for forming a transistor and an insulating film over the substrate. Further, in the case where a material with high water permeability (e.g., resin) is used for a substrate of a light-emitting device, it is preferable to form a film with low water permeability at high temperature between the substrate and a light-emitting element. In the manufacturing method of this embodiment, a transistor and the like can be formed over a formation substrate having high heat resistance; thus, a highly reliable transistor and an insulating film with sufficiently low water permeability can be formed at high temperature. Then, the transistor and the insulating film are transferred to a substrate with low heat resistance, whereby a highly reliable light-emitting panel can be manufactured. Thus, with one embodiment of the present invention, a thin or/and lightweight light-emitting device with high reliability can be provided. Details of the manufacturing method will be described later.

The substrate 103 and the substrate 201 are each preferably formed using a material with high toughness. In that case, a light-emitting panel with high impact resistance that is less likely to be broken can be provided. For example, when the substrate 103 is an organic resin substrate and the substrate 201 is a substrate formed using a thin metal material or a thin alloy material, the light-emitting panel can be lightweight and less likely to be broken as compared with the case where a glass substrate is used.

A metal material and an alloy material, which have high thermal conductivity, are preferred because they can easily conduct heat to the whole substrate and accordingly can prevent a local temperature rise in the light-emitting panel. The thickness of a substrate using a metal material or an alloy material is preferably greater than or equal to 10 µm and less than or equal to 200 µm, further preferably greater than or equal to 20 µm and less than or equal to 50 µm.

Further, when a material with high thermal emissivity is used for the substrate 201, the surface temperature of the light-emitting panel can be prevented from rising, leading to prevention of breakage or a decrease in reliability of the light-emitting panel. For example, the substrate 201 may have a stacked structure of a metal substrate and a layer with high thermal emissivity (the layer can be formed using a metal oxide or a ceramic material, for example).

<Specific Example 2>

Figure 8A:
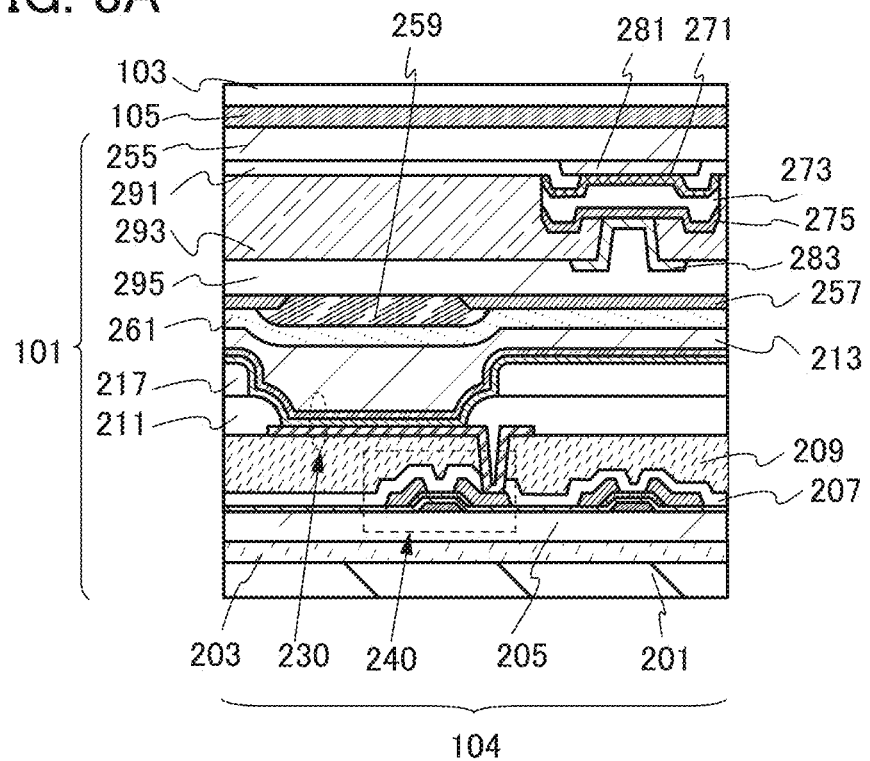
FIGS. 8A and 8B each illustrate a light-emitting panel.

FIG. 8A shows another example of the light extraction portion 104 in the light-emitting panel. The light-emitting panel shown in FIG. 8A is capable of touch operation. In the following specific examples, description of components similar to those in Specific Example 1 is omitted.

The light-emitting panel shown in FIG. 8A includes the element layer 101, the bonding layer 105, and the substrate 103. The element layer 101 includes the substrate 201, the bonding layer 203, the insulating layer 205, a plurality of transistors, the insulating layer 207, the insulating layer 209, a plurality of light-emitting elements, the insulating layer 211, an insulating layer 217, the sealing layer 213, the insulating layer 261, the coloring layer 259, the light-blocking layer 257, a plurality of light-receiving elements, a conductive layer 281, a conductive layer 283, an insulating layer 291, an insulating layer 293, an insulating layer 295, and the insulating layer 255.

Specific Example 2 includes the insulating layer 217 over the insulating layer 211. The space between the substrate 103 and the substrate 201 can be adjusted with the insulating layer 217.

FIG. 8A shows an example in which a light-receiving element is provided between the insulating layer 255 and the sealing layer 213. Since the light-receiving element can be placed to overlap with a non-light-emitting region (e.g., a region where the light-emitting element is not provided, such as a region where a transistor or a wiring is provided) of the light-emitting panel, the light-emitting panel can be provided with a touch sensor without a decrease in the aperture ratio of a pixel (light-emitting element).

As the light-receiving element included in the light-emitting panel, for example, a PN photodiode or a PIN photodiode can be used. In this embodiment, a PIN photodiode including a p-type semiconductor layer 271, an i-type semiconductor layer 273, and an n-type semiconductor layer 275 is used as the light-receiving element.

Note that the i-type semiconductor layer 273 is a semiconductor in which the concentration of each of an impurity imparting p-type conductivity and an impurity imparting n-type conductivity is $1 \times 10^{20}$ cm$^{-3}$ or less and which has photoconductivity 100 times or more as high as dark conductivity. The i-type semiconductor layer 273 also includes, in its category, a semiconductor that contains an impurity element belonging to Group 13 or Group 15 of the periodic table. In other words, since an i-type semiconductor has weak n-type electric conductivity when an impurity element for controlling valence electrons is not added intentionally, the i-type semiconductor layer 273 includes, in its category, a semiconductor to which an impurity element imparting p-type conductivity is added intentionally or unintentionally at the time of deposition or after the deposition.

The light-blocking layer 257 is closer to the substrate 201 than is the light-receiving element and overlaps with the light-receiving element. The light-blocking layer 257 between the light-receiving element and the sealing layer 213 can prevent the light-receiving element from being irradiated with light emitted from the light-emitting element 230.

The conductive layer 281 and the conductive layer 283 are electrically connected to the light-receiving element. The conductive layer 281 preferably transmits light incident on the light-receiving element. The conductive layer 283 preferably blocks light incident on the light-receiving element.

It is preferable to provide an optical touch sensor between the substrate 103 and the sealing layer 213 because the optical touch sensor is less likely to be affected by light emitted from the light-emitting element 230 and can have improved S/N ratio.

<Specific Example 3>

Figure 8B:
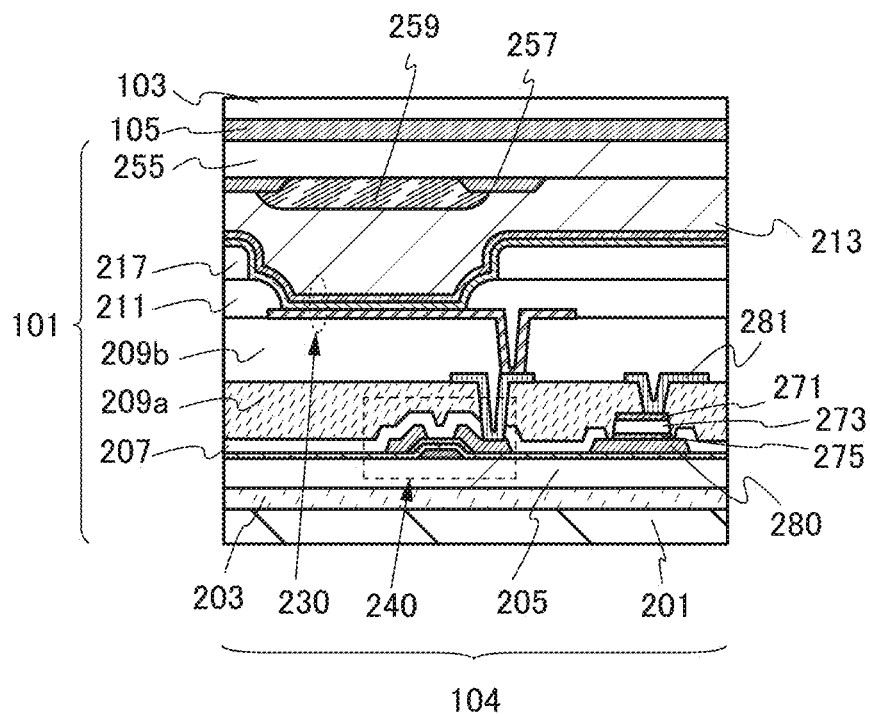

FIG. 8B shows another example of the light extraction portion 104 in the light-emitting panel. The light-emitting panel shown in FIG. 8B is capable of touch operation.

The light-emitting panel shown in FIG. 8B includes the element layer 101, the bonding layer 105, and the substrate 103. The element layer 101 includes the substrate 201, the bonding layer 203, the insulating layer 205, a plurality of transistors, the insulating layer 207, an insulating layer 209a, an insulating layer 209b, a plurality of light-emitting elements, the insulating layer 211, the insulating layer 217, the sealing layer 213, the coloring layer 259, the light-blocking layer 257, a plurality of light-receiving elements, a conductive layer 280, the conductive layer 281, and the insulating layer 255.

FIG. 8B shows an example in which a light-receiving element is provided between the insulating layer 205 and the sealing layer 213. Since the light-receiving element is provided between the insulating layer 205 and the sealing layer 213, a conductive layer to which the light-receiving element is electrically connected and a photoelectric conversion layer included in the light-receiving element can be formed using the same materials and the same steps as a conductive layer and a semiconductor layer included in the transistor 240. Thus, the light-emitting panel capable of touch operation can be manufactured without a significant increase in the number of manufacturing steps.

<Specific Example 4>

Figure 9A:
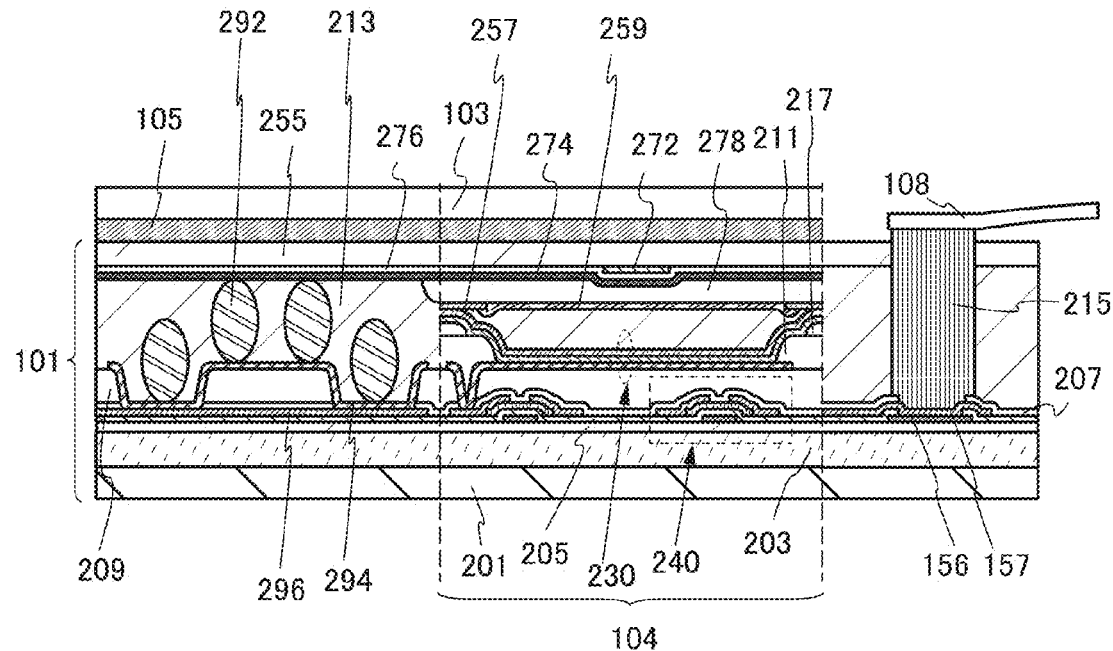
FIGS. 9A and 9B each illustrate a light-emitting panel.

FIG. 9A shows another example of a light-emitting panel. The light-emitting panel shown in FIG. 9A is capable of touch operation.

The light-emitting panel shown in FIG. 9A includes the element layer 101, the bonding layer 105, and the substrate 103. The element layer 101 includes the substrate 201, the bonding layer 203, the insulating layer 205, a plurality of transistors, a conductive layer 156, the conductive layer 157, the insulating layer 207, the insulating layer 209, a plurality of light-emitting elements, the insulating layer 211, the insulating layer 217, the sealing layer 213, the coloring layer 259, the light-blocking layer 257, the insulating layer 255, a conductive layer 272, a conductive layer 274, an insulating layer 276, an insulating layer 278, a conductive layer 294, and a conductive layer 296.

FIG. 9A shows an example in which a capacitive touch sensor is provided between the insulating layer 255 and the sealing layer 213. The capacitive touch sensor includes the conductive layer 272 and the conductive layer 274.

The conductive layer 156 and the conductive layer 157 are electrically connected to the FPC 108 via the connector 215. The conductive layer 294 and the conductive layer 296 are electrically connected to the conductive layer 274 via conductive particles 292. Thus, the capacitive touch sensor can be driven via the FPC 108.

<Specific Example 5>

Figure 9B:
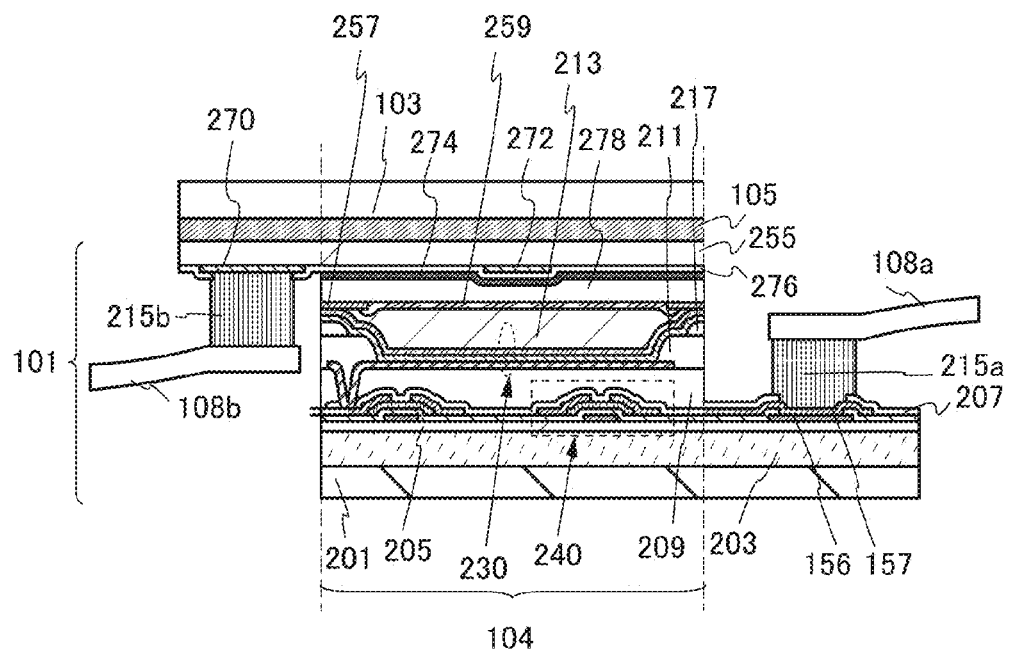

FIG. 9B shows another example of a light-emitting panel. The light-emitting panel shown in FIG. 9B is capable of touch operation.

The light-emitting panel shown in FIG. 9B includes the element layer 101, the bonding layer 105, and the substrate 103. The element layer 101 includes the substrate 201, the bonding layer 203, the insulating layer 205, a plurality of transistors, the conductive layer 156, the conductive layer 157, the insulating layer 207, the insulating layer 209, a plurality of light-emitting elements, the insulating layer 211, the insulating layer 217, the sealing layer 213, the coloring layer 259, the light-blocking layer 257, the insulating layer 255, a conductive layer 270, the conductive layer 272, the conductive layer 274, the insulating layer 276, and the insulating layer 278.

FIG. 9B shows an example in which a capacitive touch sensor is provided between the insulating layer 255 and the sealing layer 213. The capacitive touch sensor includes the conductive layer 272 and the conductive layer 274.

The conductive layer 156 and the conductive layer 157 are electrically connected to an FPC 108a via a connector 215a. The conductive layer 270 is electrically connected to an FPC 108b via a connector 215b. Thus, the light-emitting element 230 and the transistor 240 can be driven via the FPC 108a, and the capacitive touch sensor can be driven via the FPC 108b.

<Specific Example 6>

Figure 10A:
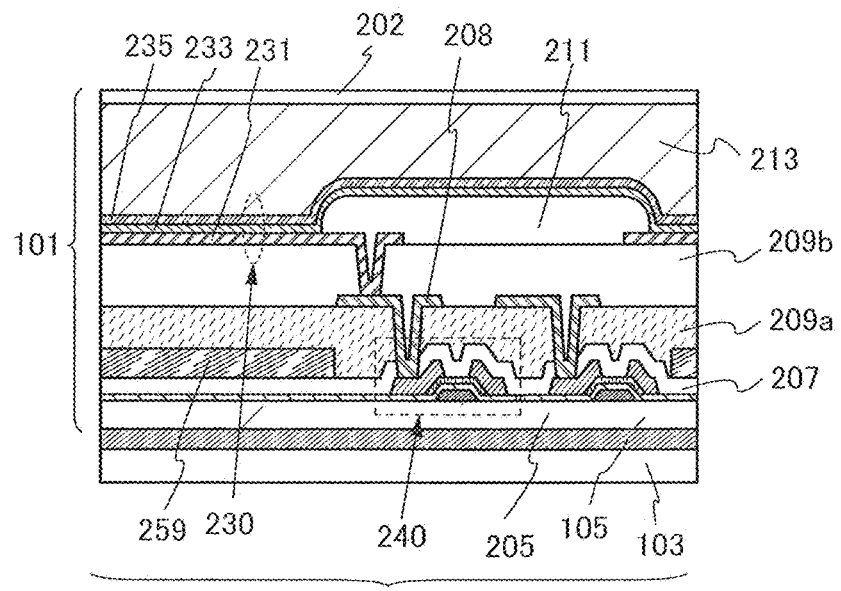
FIGS. 10A and 10B each illustrate a light-emitting panel.

FIG. 10A shows another example of the light extraction portion 104 in the light-emitting panel.

The light-emitting panel shown in FIG. 10A includes the element layer 101, the substrate 103, and the bonding layer 105. The element layer 101 includes a substrate 202, the insulating layer 205, a plurality of transistors, the insulating layer 207, a conductive layer 208, the insulating layer 209a, the insulating layer 209b, a plurality of light-emitting elements, the insulating layer 211, the sealing layer 213, and the coloring layer 259.

The light-emitting element 230 includes the lower electrode 231, the EL layer 233, and the upper electrode 235. The lower electrode 231 is electrically connected to the source electrode or the drain electrode of the transistor 240 via the conductive layer 208. An end portion of the lower electrode 231 is covered with the insulating layer 211. The light-emitting element 230 has a bottom emission structure. The lower electrode 231 has a light-transmitting property and transmits light emitted from the EL layer 233.

The coloring layer 259 is provided to overlap with the light-emitting element 230, and light emitted from the light-emitting element 230 is extracted from the substrate 103 side through the coloring layer 259. The space between the light-emitting element 230 and the substrate 202 is filled with the sealing layer 213. The substrate 202 can be formed using a material similar to that of the substrate 201.

<Specific Example 7>

Figure 10B:
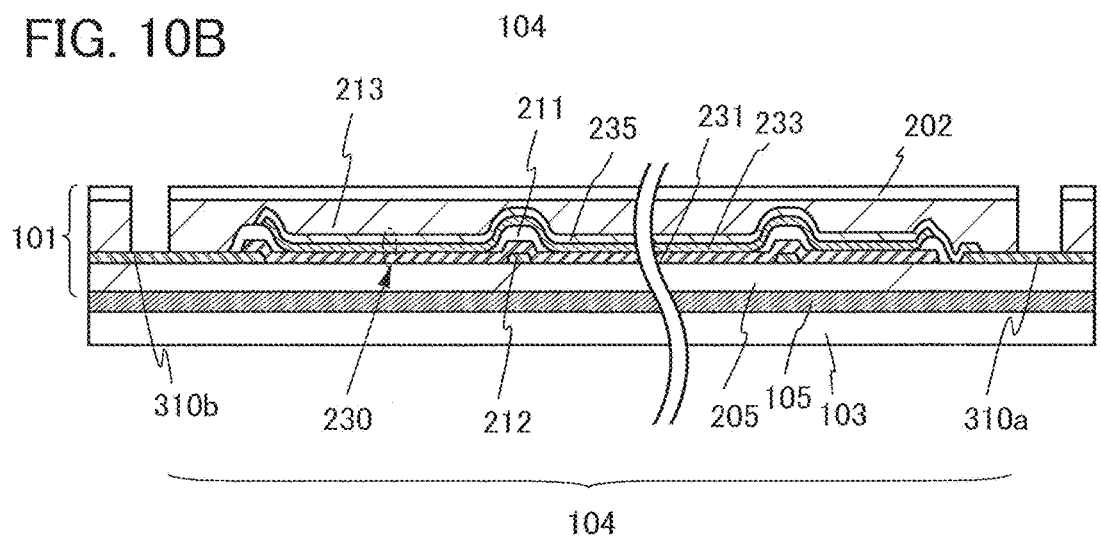

FIG. 10B shows another example of a light-emitting panel.

The light-emitting panel shown in FIG. 10B includes the element layer 101, the bonding layer 105, and the substrate 103. The element layer 101 includes the substrate 202, the insulating layer 205, a conductive layer 310a, a conductive layer 310b, a plurality of light-emitting elements, the insulating layer 211, a conductive layer 212, and the sealing layer 213.

The conductive layer 310a and the conductive layer 310b, which are external connection electrodes of the light-emitting panel, can each be electrically connected to an FPC or the like.

The light-emitting element 230 includes the lower electrode 231, the EL layer 233, and the upper electrode 235. An end portion of the lower electrode 231 is covered with the insulating layer 211. The light-emitting element 230 has a bottom emission structure. The lower electrode 231 has a light-transmitting property and transmits light emitted from the EL layer 233. The conductive layer 212 is electrically connected to the lower electrode 231.

The substrate 103 may have, as a light extraction structure, a hemispherical lens, a micro lens array, a film provided with an uneven surface structure, a light diffusing film, or the like. For example, the substrate 103 with a light extraction structure can be formed by attaching the above lens or film to a resin substrate with an adhesive or the like having substantially the same refractive index as the substrate or the lens or film.

The conductive layer 212 is preferably, though not necessarily, provided because voltage drop due to the resistance of the lower electrode 231 can be prevented. In addition, for a similar purpose, a conductive layer electrically connected to the upper electrode 235 may be provided over the insulating layer 211, the EL layer 233, the upper electrode 235, or the like.

The conductive layer 212 can be a single layer or a stacked layer formed using a material selected from copper, titanium, tantalum, tungsten, molybdenum, chromium, neodymium, scandium, nickel, or aluminum, an alloy material containing any of these materials as its main component, or the like. The thickness of the conductive layer 212 can be, for example, greater than or equal to 0.1 µm and less than or equal to 3 µm, preferably greater than or equal to 0.1 µm and less than or equal to 0.5 µm.

When a paste (e.g., silver paste) is used as a material for the conductive layer electrically connected to the upper electrode 235, metal particles forming the conductive layer aggregate; therefore, the surface of the conductive layer is rough and has many gaps. Thus, even when the conductive layer is formed over the insulating layer 211, for example, it is difficult for the EL layer 233 to completely cover the conductive layer; accordingly, the upper electrode and the conductive layer are electrically connected to each other easily, which is preferable.

<Examples of Materials>

Next, materials and the like that can be used for a light-emitting panel are described. Note that description on the components already described in this embodiment is omitted.

The element layer 101 includes at least a light-emitting element. As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The element layer 101 may further include a transistor for driving the light-emitting element, a touch sensor, or the like.

The structure of the transistors in the light-emitting panel is not particularly limited. For example, a forward staggered transistor or an inverted staggered transistor may be used. A top-gate transistor or a bottom-gate transistor may be used. A semiconductor material used for the transistors is not particularly limited, and for example, silicon or germanium can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

The light-emitting element included in the light-emitting panel includes a pair of electrodes (the lower electrode 231 and the upper electrode 235); and the EL layer 233 between the pair of electrodes. One of the pair of electrodes functions as an anode and the other functions as a cathode.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stacked film of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Further, lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Further, when a metal film or a metal oxide film is stacked on and in contact with an aluminum alloy film, oxidation of the aluminum alloy film can be prevented. Examples of a material for the metal film or the metal oxide film are titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

When a voltage higher than the threshold voltage of the light-emitting element is applied between the lower electrode 231 and the upper electrode 235, holes are injected to the EL layer 233 from the anode side and electrons are injected to the EL layer 233 from the cathode side. The injected electrons and holes are recombined in the EL layer 233 and a light-emitting substance contained in the EL layer 233 emits light.

The EL layer 233 includes at least a light-emitting layer. In addition to the light-emitting layer, the EL layer 233 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 233, either a low molecular compound or a high molecular compound can be used, and an inorganic compound may also be used. Each of the layers included in the EL layer 233 can be formed by any of the following methods: an evaporation method (including a vacuum evaporation method), a transfer method, a printing method, an inkjet method, a coating method, and the like.

In the element layer 101, the light-emitting element is preferably provided between a pair of insulating films with low water permeability. In that case, an impurity such as water can be prevented from entering the light-emitting element, leading to prevention of a decrease in the reliability of the light-emitting device.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film with low water permeability is lower than or equal to $1\times10^{-5}$ [g/m$^2$·day], preferably lower than or equal to $1\times10^{-6}$ [g/m$^2$·day], further preferably lower than or equal to $1\times10^{-7}$ [g/m$^2$·day], still further preferably lower than or equal to $1\times10$ [g/m$^2$·day].

The substrate 103 has a light-transmitting property and transmits at least light emitted from the light-emitting element included in the element layer 101. The substrate 103 may be a flexible substrate. The refractive index of the substrate 103 is higher than that of the air.

An organic resin, which is lighter than glass, is preferably used for the substrate 103, in which case the light-emitting device can be lightweight as compared with the case where glass is used.

Examples of a material having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used.

The substrate 103 may have a stacked structure of a layer of any of the above-mentioned materials and a hard coat layer (e.g., a silicon nitride layer) which protects a surface of the light-emitting device from damage or the like, a layer (e.g., an aramid resin layer) which can disperse pressure, or the like. Furthermore, to suppress a decrease in the lifetime of the light-emitting element due to moisture and the like, the insulating film with low water permeability may be included in the stacked structure.

The bonding layer 105 has a light-transmitting property and transmits at least light emitted from the light-emitting element included in the element layer 101. The refractive index of the bonding layer 105 is higher than that of the air.

For the bonding layer 105, a curable resin that is curable at room temperature (e.g., a two-component-mixture-type resin), a light curable resin, a thermosetting resin, or the like can be used. Examples of such resins include an epoxy resin, an acrylic resin, a silicone resin, and a phenol resin. In particular, a material with low moisture permeability, such as an epoxy resin, is preferred.

Further, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering the light-emitting element, thereby improving the reliability of the light-emitting device.

In addition, it is preferable to mix a filler with a high refractive index (e.g., titanium oxide) into the resin, in which case the efficiency of light extraction from the light-emitting element can be improved.

The bonding layer 105 may also include a scattering member for scattering light. For example, the bonding layer 105 can be a mixture of the above resin and particles having a refractive index different from that of the resin. The particles function as the scattering member for scattering light The difference in refractive index between the resin and the particles with a refractive index different from that of the resin is preferably 0.1 or more, further preferably 0.3 or more. Specifically, an epoxy resin, an acrylic resin, an imide resin, silicone, or the like can be used as the resin, and titanium oxide, barium oxide, zeolite, or the like can be used as the particles.

Particles of titanium oxide or barium oxide are preferable because they scatter light excellently. When zeolite is used, it can adsorb water contained in the resin and the like, thereby improving the reliability of the light-emitting element.

The insulating layer 205 and the insulating layer 255 can each be formed using an inorganic insulating material. It is particularly preferable to use the insulating film with low water permeability, in which case a highly reliable light-emitting panel can be provided.

The insulating layer 207 has an effect of preventing diffusion of impurities into a semiconductor included in the transistor. As the insulating layer 207, an inorganic insulating film such as a silicon oxide film, a silicon oxynitride film, a silicon nitride film, a silicon nitride oxide film, or an aluminum oxide film can be used.

As each of the insulating layers 209, 209a, and 209b, an insulating film with a planarization function is preferably selected in order to reduce surface unevenness due to the transistor or the like. For example, an organic material such as a polyimide resin, an acrylic resin, or a benzocyclobutene-based resin can be used. Other than such organic materials, it is also possible to use a low-dielectric constant material (a low-k material) or the like. Note that the planarization insulating film may have a stacked structure of any of insulating films formed of these materials and inorganic insulating films.

The insulating layer 211 is provided to cover an end portion of the lower electrode 231. In order that the insulating layer 211 be favorably covered with the EL layer 233 and the upper electrode 235 formed thereover, a side wall of the insulating layer 211 preferably has a tilted surface with continuous curvature.

As a material for the insulating layer, a resin or an inorganic insulating material can be used. As the resin, for example, a polyimide resin, a polyamide resin, an acrylic resin, a siloxane resin, an epoxy resin, or a phenol resin can be used. In particular, either a negative photosensitive resin or a positive photosensitive resin is preferably used for easy formation of the insulating layer 211.

There is no particular limitation on the method for forming the insulating layer 211; a photolithography method, a sputtering method, an evaporation method, a droplet discharging method (e.g., an inkjet method), a printing method (e.g., a screen printing method or an off-set printing method), or the like may be used.

The insulating layer 217 can be formed using an inorganic insulating material, an organic insulating material, or the like. As the organic insulating material, for example, a negative or positive photosensitive resin, a non-photosensitive resin, or the like can be used. Instead of the insulating layer 217, a conductive layer may be formed. For example, the conductive layer can be formed using a metal material such as titanium or aluminum. When a conductive layer is used instead of the insulating layer 217 and the conductive layer is electrically connected to the upper electrode 235, voltage drop due to the resistance of the upper electrode 235 can be prevented. The insulating layer 217 may have either a tapered shape or an inverse tapered shape.

Each of the insulating layers 276, 278, 291, 293, and 295 can be formed using an inorganic insulating material or an organic insulating material. It is particularly preferable to use an insulating film with a planarization function for each of the insulating layers 278 and 295 in order to reduce surface unevenness due to a sensor element.

For the sealing layer 213, a resin that is curable at room temperature (e.g., a two-component-mixture-type resin), a light curable resin, a thermosetting resin, or the like can be used. For example, a polyvinyl chloride (PVC) resin, an acrylic resin, a polyimide resin, an epoxy resin, a silicone resin, a polyvinyl butyral (PVB) resin, an ethylene vinyl acetate (EVA) resin, or the like can be used. A drying agent may be contained in the sealing layer 213. In the case where light emitted from the light-emitting element 230 is extracted outside through the sealing layer 213, the sealing layer 213 preferably includes a filler with a high refractive index or a scattering member. Materials for the drying agent, the filler with a high refractive index, and the scattering member are similar to those that can be used for the bonding layer 105.

Each of the conductive layers 156, 157, 294, and 296 can be formed using the same material and the same step as a conductive layer included in the transistor or the light-emitting element. The conductive layer 280 can be formed using the same material and the same step as a conductive layer included in the transistor.

For example, each of the conductive layers can be formed to have a single-layer structure or a stacked-layer structure using any of metal materials such as molybdenum, titanium, chromium, tantalum, tungsten, aluminum, copper, neodymium, and scandium, and an alloy material containing any of these elements. Each of the conductive layers may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials in which silicon oxide is contained can be used.

Each of the conductive layers 208, 212, 310a, and 310b can also be formed using any of the above metal materials, alloy materials, and conductive metal oxides.

Each of the conductive layers 272, 274, 281, and 283 is a conductive layer with a light-transmitting property. The conductive layer can be formed using, for example, indium oxide, ITO, indium zinc oxide, zinc oxide, zinc oxide to which gallium is added, or the like. The conductive layer 270 can be formed using the same material and the same step as the conductive layer 272.

As the conductive particles 292, particles of an organic resin, silica, or the like coated with a metal material are used. It is preferable to use nickel or gold as the metal material because contact resistance can be reduced. It is also preferable to use particles each coated with layers of two or more kinds of metal materials, such as particles coated with nickel and further with gold.

For the connector 215, it is possible to use a paste-like or sheet-like material which is obtained by mixture of metal particles and a thermosetting resin and for which anisotropic electric conductivity is provided by thermocompression bonding. As the metal particles, particles in which two or more kinds of metals are layered, for example, nickel particles coated with gold are preferably used.

The coloring layer 259 is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an inkjet method, an etching method using a photolithography method, or the like.

The light-blocking layer 257 is provided between the adjacent coloring layers 259. The light-blocking layer 257 blocks light emitted from the adjacent light-emitting element, thereby preventing color mixture between adjacent pixels. Here, the coloring layer 259 is provided such that its end portion overlaps with the light-blocking layer 257, whereby light leakage can be reduced. The light-blocking layer 257 can be formed using a material that blocks light emitted from the light-emitting element, for example, a metal material, a resin material including a pigment or a dye, or the like. Note that the light-blocking layer 257 is preferably provided in a region other than the light extraction portion 104, such as the driver circuit portion 106, as illustrated in FIG. 7B, in which case undesired leakage of guided light or the like can be prevented.

The insulating layer 261 covering the coloring layer 259 and the light-blocking layer 257 is preferably provided because it can prevent an impurity such as a pigment included in the coloring layer 259 or the light-blocking layer 257 from diffusing into the light-emitting element or the like. For the insulating layer 261, a light-transmitting material is used, and an inorganic insulating material or an organic insulating material can be used. The insulating film with low water permeability may be used for the insulating layer 261. Note that the insulating layer 261 is not necessarily provided.

<Example of Manufacturing Method>

Next, an example of a method for manufacturing a light-emitting panel will be described with reference to FIGS. 11A to 11C and FIGS. 12A to 12C. Here, the manufacturing method is described using the light-emitting panel of Specific Example 1 (FIG. 7B) as an example.

First, a separation layer 303 is formed over a formation substrate 301, and the insulating layer 205 is formed over the separation layer 303. Next, the plurality of transistors, the conductive layer 157, the insulating layer 207, the insulating layer 209, the plurality of light-emitting elements, and the insulating layer 211 are formed over the insulating layer 205.

Figure 11A:
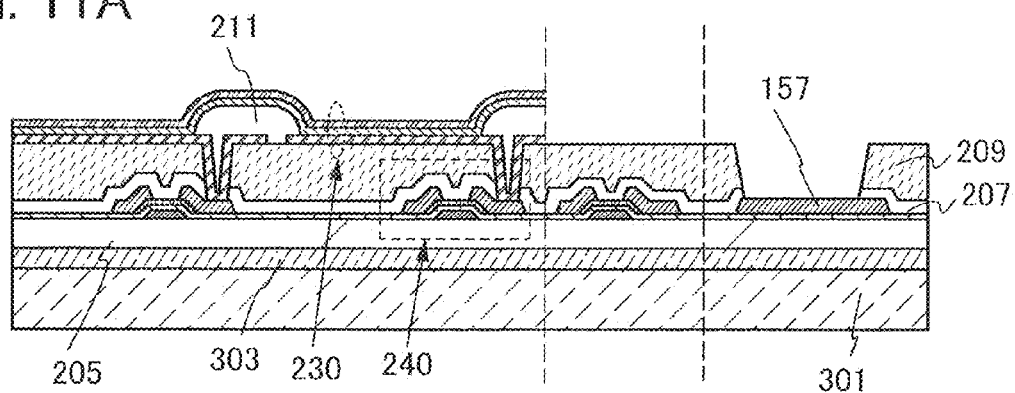
FIGS. 11A to 11C illustrate a method for manufacturing a light-emitting panel.

An opening is formed in the insulating layers 211, 209, and 207 to expose the conductive layer 157 (FIG. 11A).

Figure 11B:
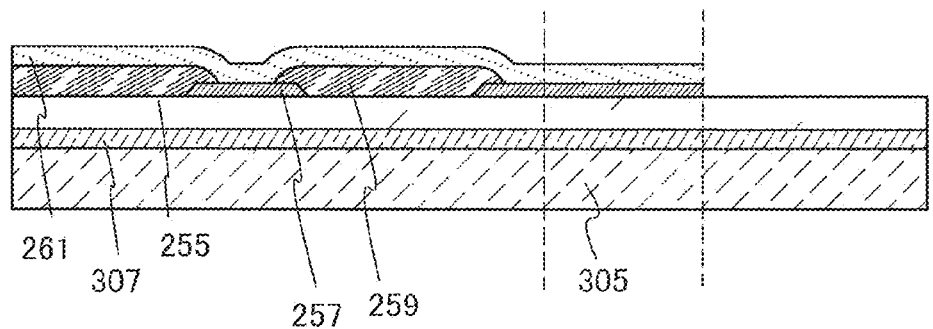

In addition, a separation layer 307 is formed over a formation substrate 305, and the insulating layer 255 is formed over the separation layer 307. Next, the light-blocking layer 257, the coloring layer 259, and the insulating layer 261 are formed over the insulating layer 255 (FIG. 11B).

The formation substrate 301 and the formation substrate 305 can each be a glass substrate, a quartz substrate, a sapphire substrate, a ceramic substrate, a metal substrate, or the like.

For the glass substrate, for example, a glass material such as aluminosilicate glass, aluminoborosilicate glass, or barium borosilicate glass can be used. When the temperature of heat treatment performed later is high, a substrate having a strain point of 730° C. or higher is preferably used. Note that when containing a large amount of barium oxide (BaO), the glass substrate can be heat-resistant and more practical. Alternatively, crystallized glass or the like may be used.

In the case where a glass substrate is used as the formation substrate, an insulating film such as a silicon oxide film, a silicon oxynitride film, a silicon nitride film, or a silicon nitride oxide film is preferably formed between the formation substrate and the separation layer, in which case contamination from the glass substrate can be prevented.

The separation layer 303 and the separation layer 307 each have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements. A crystal structure of a layer containing silicon may be amorphous, microcrystal, or polycrystal.

The separation layer can be formed by a sputtering method, a plasma CVD method, a coating method, a printing method, or the like. Note that a coating method includes a spin coating method, a droplet discharge method, and a dispensing method.

In the case where the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum corresponds to an alloy of tungsten and molybdenum, for example.

In the case where the separation layer is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating layer formed later can be controlled.

Each of the insulating layers can be formed by a sputtering method, a plasma CVD method, a coating method, a printing method, or the like. For example, the insulating layer is formed at a temperature of higher than or equal to 250° C. and lower than or equal to 400° C. by a plasma CVD method, whereby the insulating layer can be a dense film with very low water permeability.

Figure 11C:
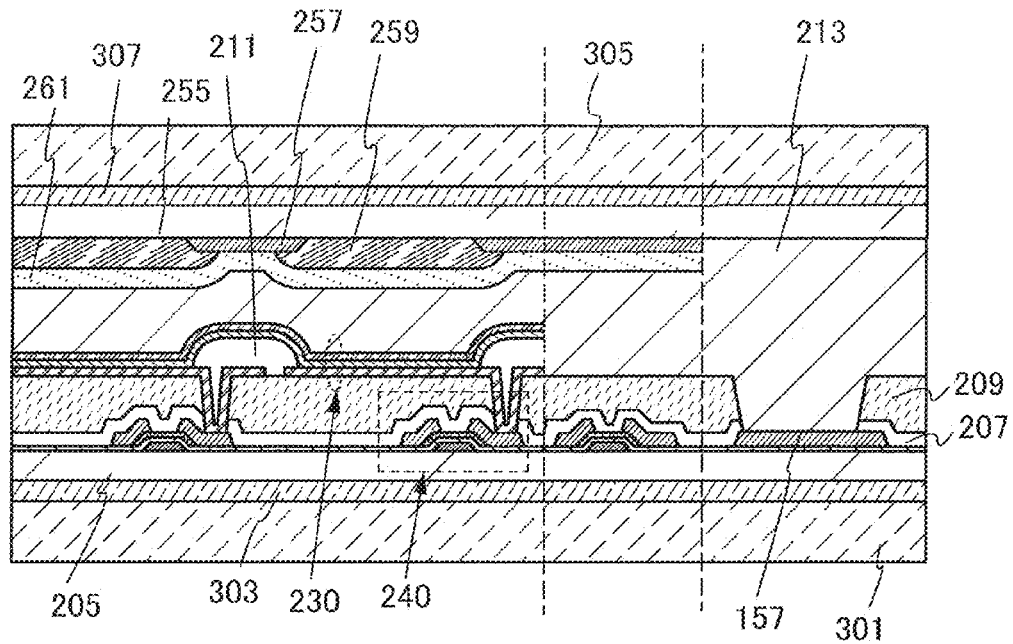

Then, a material for the sealing layer 213 is applied to a surface of the formation substrate 305 over which the coloring layer 259 and the like are formed or a surface of the formation substrate 301 over which the light-emitting element 230 and the like are formed, and the formation substrate 301 and the formation substrate 305 are attached so that these two surfaces face each other with the sealing layer 213 positioned therebetween (FIG. 11C).

Next, the formation substrate 301 is separated, and the exposed insulating layer 205 and the substrate 201 are attached to each other with the bonding layer 203. Further, the formation substrate 305 is separated, and the exposed insulating layer 255 and the substrate 103 are attached to each other with the bonding layer 105. Although the substrate 103 does not overlap with the conductive layer 157 in FIG. 12A, the substrate 103 may overlap with the conductive layer 157.

Any of a variety of methods can be used as appropriate for the separation process. For example, when a layer including a metal oxide film is formed as the separation layer on the side in contact with the layer to be separated, the metal oxide film is embrittled by crystallization, whereby the layer to be separated can be separated from the formation substrate. Alternatively, when an amorphous silicon film containing hydrogen is formed as the separation layer between the formation substrate having high heat resistance and the layer to be separated, the amorphous silicon film is removed by laser light irradiation or etching, whereby the layer to be separated can be separated from the formation substrate. Alternatively, after a layer including a metal oxide film is formed as the separation layer on the side in contact with the layer to be separated, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film. Furthermore, a method may be used in which a film containing nitrogen, oxygen, hydrogen, or the like (for example, an amorphous silicon film containing hydrogen, an alloy film containing hydrogen, an alloy film containing oxygen, or the like) is used as the separation layer, and the separation layer is irradiated with laser light to release the nitrogen, oxygen, or hydrogen contained in the separation layer as a gas, thereby promoting separation between the layer to be separated and the formation substrate. Alternatively, it is possible to use a method in which the formation substrate provided with the layer to be separated is removed mechanically or by etching using a solution or a fluoride gas such as $NF_3$, $BrF_3$, or $ClF_3$, or the like. In this case, the separation layer is not necessarily provided.

Further, the separation process can be conducted easily by combination of the above-described separation methods. In other words, separation can be performed with physical force (by a machine or the like) after performing laser light irradiation, etching on the separation layer with a gas, a solution, or the like, or mechanical removal with a sharp knife, scalpel or the like so that the separation layer and the layer to be separated can be easily separated from each other.

Separation of the layer to be separated from the formation substrate may be carried out by filling the interface between the separation layer and the layer to be separated with a liquid. Further, the separation may be conducted while pouring a liquid such as water.

As another separation method, in the case where the separation layer is formed using tungsten, it is preferable that the separation be performed while etching the separation layer using a mixed solution of ammonium water and a hydrogen peroxide solution.

Note that the separation layer is not necessary in the case where separation at the interface between the formation substrate and the layer to be separated is possible. For example, glass is used as the formation substrate, an organic resin such as polyimide, polyester, polyolefin, polyamide, polycarbonate, or acrylic is formed in contact with the glass, and an insulating film, a transistor, and the like are formed over the organic resin. In this case, heating the organic resin enables the separation at the interface between the formation substrate and the organic resin. Alternatively, separation at the interface between a metal layer and the organic resin may be performed in the following manner: the metal layer is provided between the formation substrate and the organic resin and current is made to flow in the metal layer so that the metal layer is heated. The organic resin separated from the formation substrate can be used as a substrate of the light-emitting panel. Alternatively, the organic resin may be attached to a substrate with an adhesive.

Figure 12A:
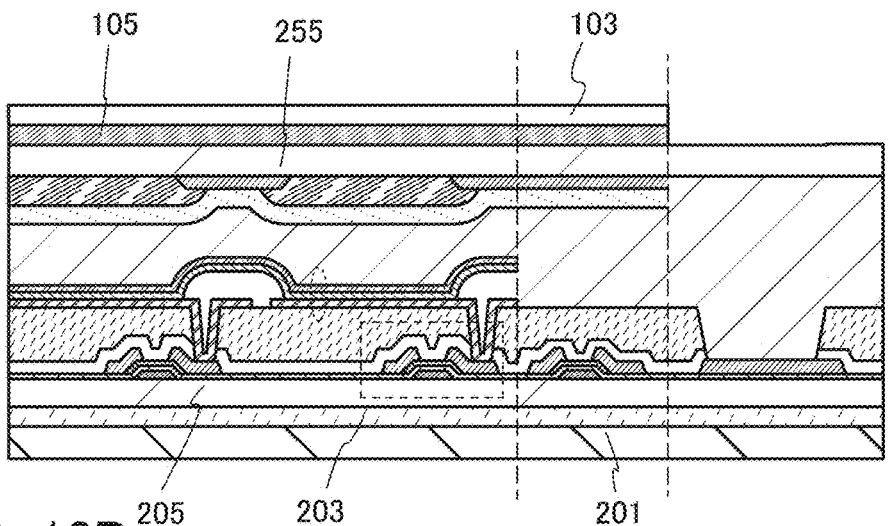
FIGS. 12A to 12C illustrate a method for manufacturing a light-emitting panel.
Figure 12B:
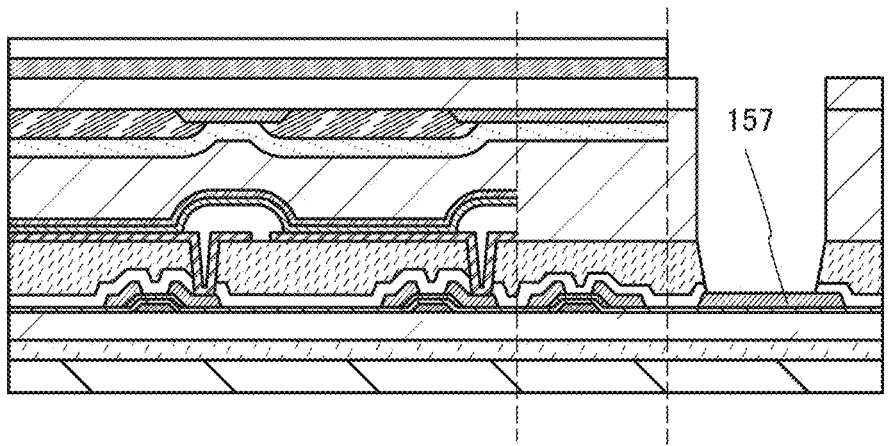
Figure 12C:
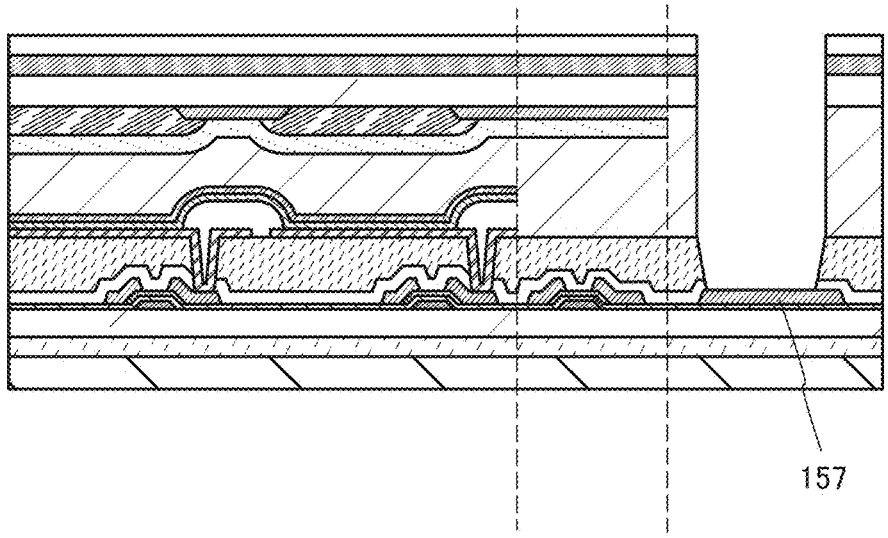

Lastly, an opening is formed in the insulating layer 255 and the sealing layer 213 to expose the conductive layer 157 (FIG. 12B). In the case where the substrate 103 overlaps with the conductive layer 157, the opening is formed also in the substrate 103 and the bonding layer 105 so that the conductive layer 157 is exposed (FIG. 12C). The method for forming the opening is not particularly limited and may be, for example, a laser ablation method, an etching method, an ion beam sputtering method, or the like. As another method, a cut may be made in a film over the conductive layer 157 with a sharp knife or the like and part of the film may be separated by physical force.

In the above-described manner, the light-emitting panel can be manufactured.

As described above, the light-emitting panel of this embodiment includes two substrates; one is the substrate 103 and the other is the substrate 201 or the substrate 202. The light-emitting panel can be formed with two substrates even when including a touch sensor. Owing to the use of the minimum number of substrates, improvement in light extraction efficiency and improvement in clarity of display can be easily achieved.

This embodiment can be combined with any other embodiment as appropriate.

Embodiment 3

In this embodiment, a light-emitting panel will be described with reference to FIG. 13.

Figure 13:
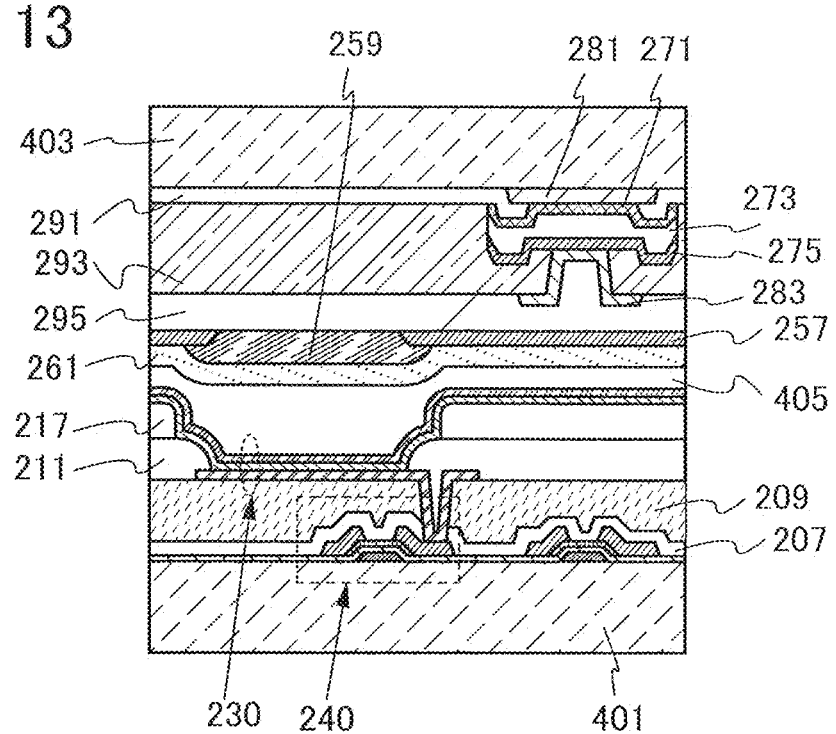
FIG. 13 illustrates a light-emitting panel.

The light-emitting panel shown in FIG. 13 includes a substrate 401, the transistor 240, the light-emitting element 230, the insulating layer 207, the insulating layer 209, the insulating layer 211, the insulating layer 217, a space 405, the insulating layer 261, the light-blocking layer 257, the coloring layer 259, a light-receiving element (including the p-type semiconductor layer 271, the i-type semiconductor layer 273, and the n-type semiconductor layer 275), the conductive layer 281, the conductive layer 283, the insulating layer 291, the insulating layer 293, the insulating layer 295, and a substrate 403.

The light-emitting panel includes a bonding layer (not shown) formed in a frame shape between the substrate 401 and the substrate 403 to surround the light-emitting element 230 and the light-receiving element. The light-emitting element 230 is sealed by the bonding layer, the substrate 401, and the substrate 403.

In the light-emitting panel of this embodiment, the substrate 403 has a light-transmitting property. Light emitted from the light-emitting element 230 is extracted to the air through the coloring layer 259, the substrate 403, and the like.

The light-emitting panel of this embodiment is capable of touch operation. Specifically, proximity or contact of an object on a surface of the substrate 403 can be sensed with the light-receiving element.

An optical touch sensor s highly durable and preferable because its sensing accuracy is not affected by damage to a surface that is touched by an object. An optical touch sensor is also advantageous in that it is capable of noncontact sensing, it does not degrade the clarity of images when used in a display device, and it is applicable to large-sized light-emitting panels and display devices.

It is preferable to provide an optical touch sensor between the substrate 403 and the space 405 because the optical touch sensor is less likely to be affected by light emitted from the light-emitting element 230 and can have improved S/N ratio.

The light-blocking layer 257 is closer to the substrate 401 than is the light-receiving element and overlaps with the light-receiving element. The light-blocking layer 257 can prevent the light-receiving element from being irradiated with light emitted from the light-emitting element 230.

There is no particular limitation on materials used for the substrates 401 and 403. The substrate through which light emitted from the light-emitting element is extracted is formed using a material that transmits the light. For example, a material such as glass, quartz, ceramics, sapphire, or an organic resin can be used. Since the substrate through which light is not extracted does not need a light-transmitting property, a metal substrate or the like using a metal material or an alloy material can be used as well as the above-mentioned substrates. Further, any of the materials for the substrates given in the above embodiments can also be used for the substrates 401 and 403.

A method for sealing the light-emitting panel is not limited, and either solid sealing or hollow sealing can be employed. For example, as a sealing material, a glass material such as a glass frit, or a resin material such as a resin that is curable at room temperature (e.g., a two-component-mixture-type resin), a light curable resin, or a thermosetting resin can be used. The space 405 may be filled with an inert gas such as nitrogen or argon, or with a resin or the like similar to that used for the sealing layer 213. Further, the resin may include the drying agent, the filler with a high refractive index, or the scattering member.

This embodiment can be combined with any other embodiment as appropriate.

EXAMPLE

In this example, a light-emitting device of one embodiment of the present invention was fabricated. The light-emitting device of this example can be called a tri-fold folding screen type display.

Figure 18A:
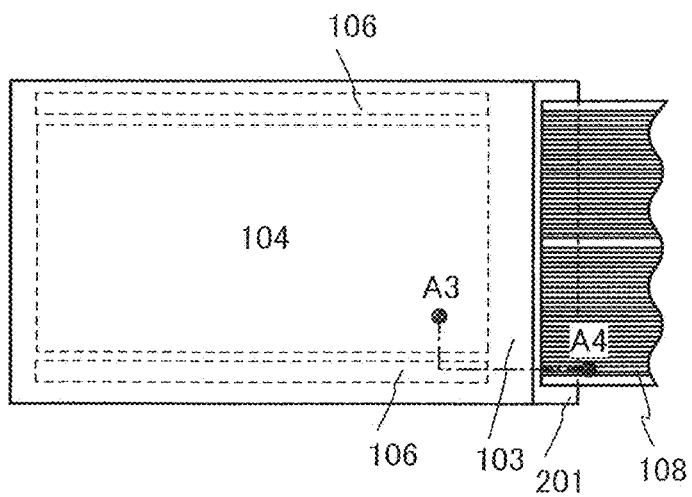
FIGS. 18A and 18B illustrate a light-emitting panel.
Figure 18B:
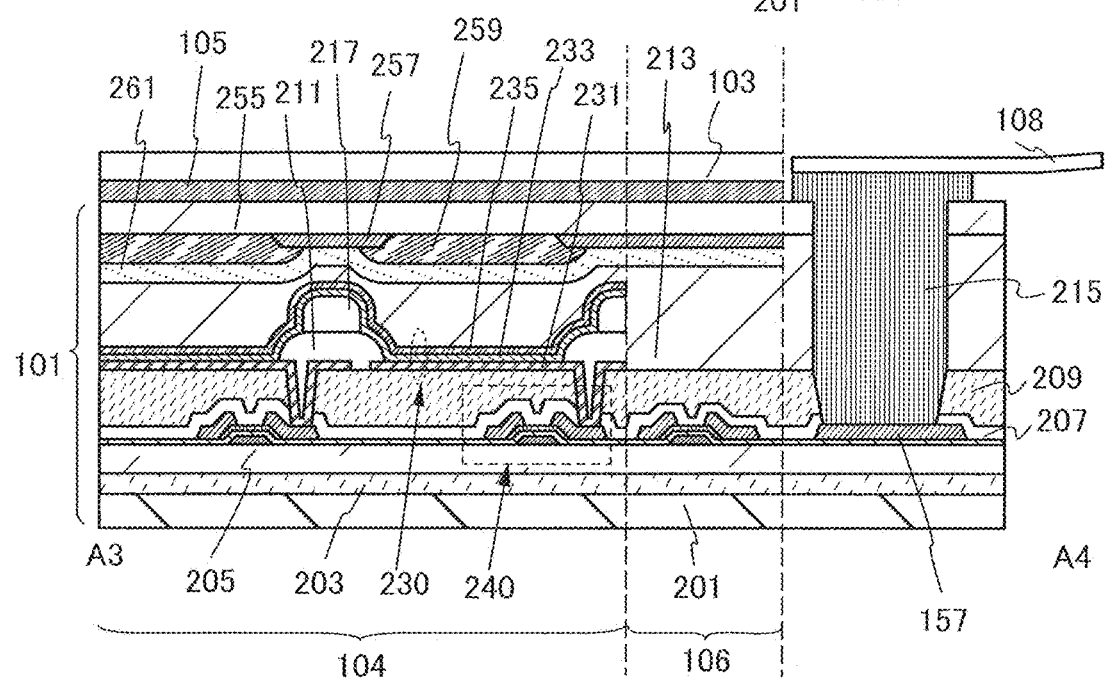

FIGS. 18A and 18B illustrate a light-emitting panel of the light-emitting device fabricated in this example. The light-emitting device fabricated in this example differs from Specific Example 1 (FIG. 7B) described in Embodiment 2 in that the substrate 103 and the substrate 201 have different sizes and in that the insulating layer 217 is provided between pixels of different colors. For other components, description of Specific Example 1 and the like can be referred to. For the insulating layer 217, description of Specific Example 2 and the like can be referred to.

The light-emitting panel was fabricated by using the fabrication method described in Embodiment 2.

First, the separation layer 303 was formed over a glass substrate serving as the formation substrate 301, and a layer to be separated was formed over the separation layer 303. In addition, the separation layer 307 was formed over a glass substrate serving as the formation substrate 305, and a layer to be separated was formed over the separation layer 307. Next, the formation substrate 301 and the formation substrate 305 were attached so that the surfaces on which the layers to be separated were formed faced each other. Then, the two formation substrates were separated from the layers to be separated, and flexible substrates were attached to the layers to be separated. Materials for each of the layers are described below.

A stacked-layer structure of a tungsten film and a tungsten oxide film over the tungsten film was formed as each of the separation layers 303 and 307.

The stacked-layer structure of the separation layer right after deposition is not easily separated; however, by reaction with an inorganic insulating film by heat treatment, the state of the interface between the separation layer and the inorganic insulating film is changed to become brittle. Then, forming a starting point of separation enables physical separation.

As the layer to be separated over the separation layer 303, the insulating layer 205, a transistor, and an organic EL element serving as the light-emitting element 230 were formed. As the layer to be separated over the separation layer 307, the insulating layer 255, a color filter (corresponding to the coloring layer 259), and the like were formed.

A stacked-layer structure including a silicon oxynitride film, a silicon nitride film, and the like was used as each of the insulating layers 205 and 255.

As the transistor, a transistor including a c-axis aligned crystalline oxide semiconductor (CAAC-OS) was used. Since the CAAC-OS, which is not amorphous, has few defect states, using the CAAC-OS can improve the reliability of the transistor. Moreover, since the CAAC-OS does not have a grain boundary, stress that is caused by bending a flexible device does not easily make a crack in a CAAC-OS film.

A CAAC-OS is an oxide semiconductor having c-axis alignment in a direction substantially perpendicular to the film surface. It has been found that oxide semiconductors have a variety of crystal structures other than an amorphous structure and a single-crystal structure. An example of such structures is a nano-crystal (nc) structure, which is an aggregate of nanoscale microcrystals. The crystallinity of a CAAC structure is lower than that of a single-crystal structure but higher than those of an amorphous structure and an nc structure.

In this example, a channel-etched transistor including an In—Ga—Zn-based oxide was used. The transistor can be fabricated over a glass substrate at a process temperature lower than 500° C.

In a method of fabricating an element such as a transistor directly over an organic resin such as a plastic substrate, the temperature of the process for fabricating the element needs to be lower than the upper temperature limit of the organic resin. In this example, the formation substrate is a glass substrate and the separation layer, which is an inorganic film, has high heat resistance; accordingly, the transistor can be fabricated at a temperature equal to that when a transistor is fabricated over a glass substrate. Thus, the performance and reliability of the transistor can be easily secured.

As the light-emitting element 230, a tandem organic EL element that includes a fluorescence-emitting unit including a blue light-emitting layer and a phosphorescence-emitting unit including a green light-emitting layer and a red light-emitting layer was used. The light-emitting element 230 has a top emission structure. As the lower electrode 231 of the light-emitting element 230, an aluminum film, a titanium film over the aluminum film, and an ITO film serving as an optical adjustment layer over the titanium film were stacked. The thickness of the optical adjustment layer was varied depending on the color of the pixel. Owing to the combination of a color filter and a microcavity structure, light with high color purity can be extracted from the light-emitting panel fabricated in this example. As each of the substrates 103 and 201, a 20-μm-thick flexible organic resin film was used.

The fabricated light-emitting panel had a size of a light-emitting portion (pixel portion) of 5.9 inches diagonal, 720×1280×3 (RGB) pixels, a pixel pitch of 0.102 mm×0.102 mm, a resolution of 249 ppi, and an aperture ratio of 45.2%. A built-in scan driver and an external source driver attached by chip on film (COF) were used.

Figure 19A:
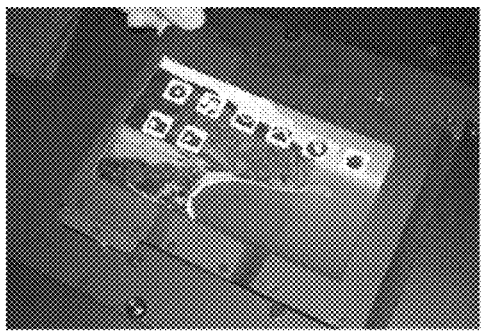
FIGS. 19A to 19D show a light-emitting device.
Figure 19B:
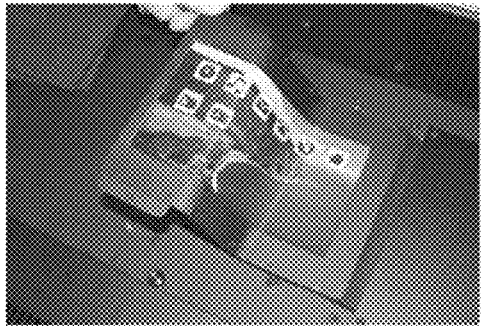
Figure 19C:
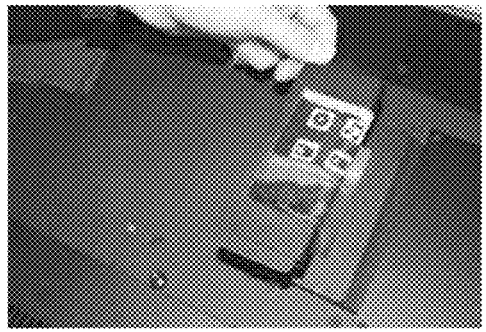
Figure 19D:

FIGS. 19A to 19D are photographs showing the display on the light-emitting device fabricated in this example. FIG. 19A shows the light-emitting device that is opened, FIGS. 19B and 19C each show the light-emitting device that is being folded, and FIG. 19D shows the light-emitting device that is folded. The curvature radius of a folded portion was 4 mm. The light-emitting device of this example had no problem in display and driving even when it was folded while displaying an image. The light-emitting device of this example has a function of sensing whether it is in an opened state or in a folded state with a sensor and displaying different images depending on the state. Owing to this function, the light-emitting device also has a function of saving power by stopping the driving of a region of the light-emitting panel that is hidden in a folded state.

Here, if the light-emitting panel is completely fixed with a pair of protective layers and/or a pair of support panels, when the light-emitting device is folded, the light-emitting panel is under tension to be broken in some cases. In addition, when the light-emitting device is opened, the light-emitting panel is under force in a direction to cause contraction of the light-emitting panel to be broken in some cases. The light-emitting panel of the light-emitting device fabricated in this example is not completely fixed with a pair of protective layers and/or a pair of support panels. Accordingly, when the light-emitting device is folded or opened, the light-emitting panel slides so that the position of the light-emitting panel with respect to the pair of protective layers and/or the pair of support panels changes. Thus, the light-emitting panel can be prevented from being broken by being under force.

Figure 20A:
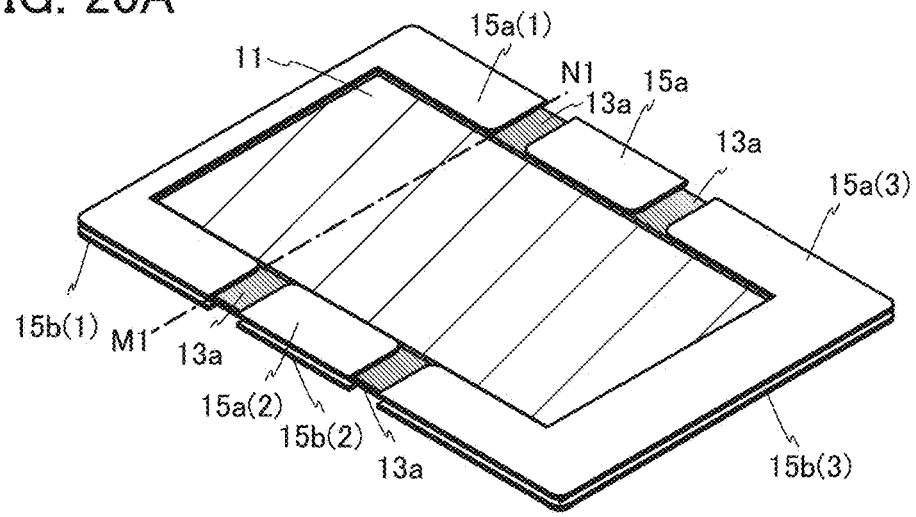
FIGS. 20A to 20C illustrate a light-emitting device.
Figure 20B:
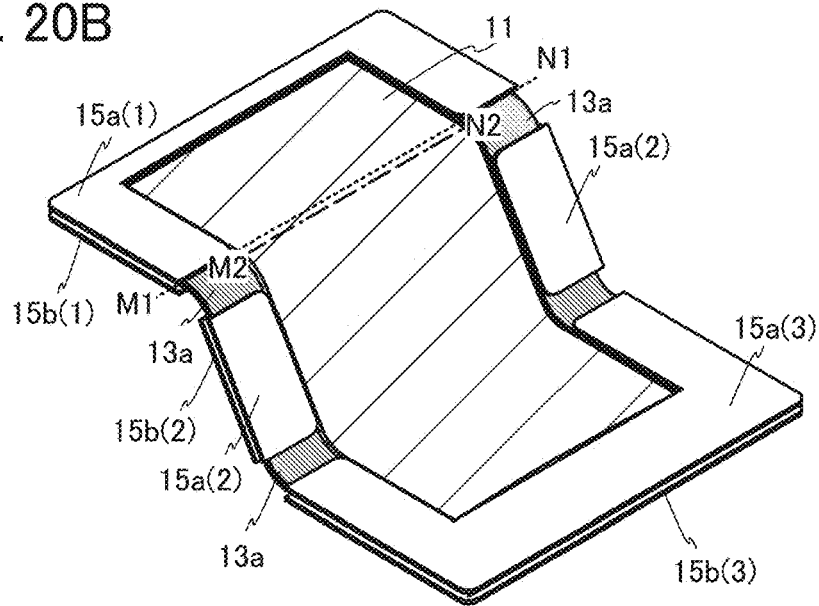
Figure 20C:
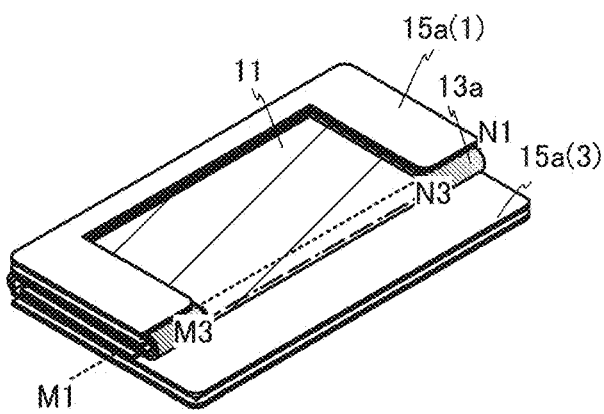

FIGS. 20A to 20C illustrate a light-emitting device of one embodiment of the present invention. Here, the light-emitting panel 11 is not fixed with a pair of support panels 15a(1) and 15b(1). The light-emitting panel 11 is supported with a pair of support panels 15a(2) and 15b(2), a pair of support panels 15a(3) and 15b(3), or both of these pairs. Although the light-emitting device of one embodiment of the present invention includes a plurality of pairs of support panels, the light-emitting panel only needs to be fixed with at least one pair of support panels.

The display on the light-emitting panel 11 along dashed-dotted line M1-N1 in the light-emitting device in an opened state shown in FIG. 20A is along dashed-dotted line M2-N2 in the light-emitting device that is being folded, shown in FIG. 20B. Furthermore, the display is along dashed-dotted line M3-N3 in the light-emitting device in a folded state shown in FIG. 20C. In this manner, in the light-emitting device of one embodiment of the present invention, the light-emitting panel slides when the light-emitting device is folded or opened because the light-emitting panel is not completely fixed with a pair of protective layers and/or a pair of support panels. Accordingly, the position of the light-emitting panel with respect to the pair of protective layers and/or the pair of support panels changes. Thus, the light-emitting panel can be prevented from being broken by being under force.

EXPLANATION OF REFERENCE

11: light-emitting panel, 11a: light-emitting region, 11b: non-light-emitting region, 13: protective layer, 13a: protective layer, 13b: protective layer, 15: support panel, 15a: support panel, 15b: support panel, 101: element layer, 103: substrate, 104: light extraction portion, 105: bonding layer, 106: driver circuit portion, 108: FPC, 108a: FPC, 108b: FPC, 156: conductive layer, 157: conductive layer, 201: substrate, 202: substrate, 203: bonding layer, 205: insulating layer, 207: insulating layer, 208: conductive layer, 209: insulating layer, 209a: insulating layer, 209b: insulating layer, 211: insulating layer, 212: conductive layer, 213: sealing layer, 215: connector, 215a: connector, 215b: connector, 217: insulating layer, 230: light-emitting element, 231: lower electrode, 233: EL layer, 235: upper electrode, 240: transistor, 255: insulating layer, 257: light-blocking layer, 259: coloring layer, 261: insulating layer, 270: conductive layer, 271: p-type semiconductor layer, 272: conductive layer, 273: i-type semiconductor layer, 274: conductive layer, 275: n-type semiconductor layer, 276: insulating layer, 278: insulating layer, 280: conductive layer, 281: conductive layer, 283: conductive layer, 291: insulating layer, 292: conductive particles, 293: insulating layer, 294: conductive layer, 295: insulating layer, 296: conductive layer, 301: formation substrate, 303: separation layer 305: formation substrate, 307: separation layer, 310a: conductive layer, 310b: conductive layer, 401: substrate, 403: substrate, 405: space.

This application is based on Japanese Patent Application serial No. 2013-146291 filed with Japan Patent Office on Jul. 12, 2013, Japanese Patent Application serial No. 2013-146293 filed with Japan Patent Office on Jul. 12, 2013, and Japanese Patent Application serial No. 2013-249155 filed with Japan Patent Office on Dec. 2, 2013, the entire contents of which are hereby incorporated by reference.

The invention claimed is:

1. A light-emitting device comprising:
a flexible light-emitting panel;
a first support that supports the flexible light-emitting panel;
a second support that supports the flexible light-emitting panel; and
a sensor capable of determining whether the light-emitting device is in an opened state or a folded state,
wherein the light-emitting device is foldable so that the flexible light-emitting panel is bent between the first support and the second support,
wherein the light-emitting device is capable of putting a region of the flexible light-emitting panel in a non-light-emitting state, the region being hidden in the folded state, and
wherein the first support and the second support are adjacent to each other and are apart from each other.

2. The light-emitting device according to claim 1, wherein light-emitting device is foldable in three.

3. The light-emitting device according to claim 1, wherein the first support is thicker than the flexible light-emitting panel.

4. The light-emitting device according to claim 1,
wherein the flexible light-emitting panel comprises:
a transistor;
an insulating layer over the transistor;
a light-emitting element over the insulating layer, the light-emitting element being electrically connected to the transistor; and
a touch sensor over the light-emitting element,
wherein the flexible light-emitting panel is foldable with a curvature radius greater than or equal to 1 mm and less than or equal to 10 mm.

5. A light-emitting device comprising:
a flexible light-emitting panel;
a first support that supports the flexible light-emitting panel;
a second support that supports the flexible light-emitting panel; and
a sensor capable of determining whether the light-emitting device is in an opened state or a folded state,
wherein the light-emitting device is foldable so that the flexible light-emitting panel is bent between the first support and the second support,
wherein the light-emitting device is capable of displaying different images in the opened state and the folded state, and
wherein the first support and the second support are adjacent to each other and are apart from each other.

6. The light-emitting device according to claim 5, wherein the light-emitting device is foldable in three.

7. The light-emitting device according to claim 5, wherein the first support is thicker than the flexible light-emitting panel.

8. The light-emitting device according to claim 5,
wherein the flexible light-emitting panel comprises:
a transistor;
an insulating layer over the transistor;
a light-emitting element over the insulating layer, the light-emitting element being electrically connected to the transistor; and
a touch sensor over the light-emitting element,
wherein the flexible light-emitting panel is foldable with a curvature radius greater than or equal to 1 mm and less than or equal to 10 mm.

9. A light-emitting device comprising:
a flexible light-emitting panel;
a first support that supports the flexible light-emitting panel;
a second support that supports the flexible light-emitting panel; and
a sensor capable of determining whether the light-emitting device is in an opened state or a folded state, wherein the light-emitting device is foldable so that the flexible light-emitting panel is bent between the first support and the second support,
wherein the light-emitting device is capable of putting a region of the flexible light-emitting panel in a non-light-emitting state, the region being hidden in the folded state,
wherein the first support and the second support are adjacent to each other and are apart from each other,
wherein the first support is thicker than the flexible light-emitting panel,
wherein the flexible light-emitting panel comprises:
a transistor;
an insulating layer over the transistor;
a light-emitting element over the insulating layer, the light-emitting element being electrically connected to the transistor; and
a touch sensor over the light-emitting element,
wherein the flexible light-emitting panel is foldable with a curvature radius greater than or equal to 1 mm and less than or equal to 10 mm.

10. The light-emitting device according to claim 9, wherein the light-emitting device is foldable in three.

11. The light-emitting device according to claim 9, wherein the light-emitting device is capable of displaying different images in the opened state and the folded state.

12. The light-emitting device according to claim 1, wherein the flexible light-emitting panel comprises an electroluminescence element.

13. The light-emitting device according to claim 5, wherein the flexible light-emitting panel comprises an electroluminescence element.

14. The light-emitting device according to claim 9, wherein the flexible light-emitting panel comprises an electroluminescence element.

15. A light-emitting device comprising:
a flexible light-emitting panel;
a first support that supports the flexible light-emitting panel;
a second support that supports the flexible light-emitting panel; and
a sensor capable of determining whether the light-emitting device is in an opened state or a folded state,
wherein the light-emitting device is foldable so that the flexible light-emitting panel is bent between the first support and the second support,
wherein, when the sensor determines the light-emitting device is the folded state, the light-emitting device is capable of displaying an image that does not depend on an image in the opened state, and
wherein the first support and the second support are adjacent to each other and are apart from each other.

16. The light-emitting device according to claim 15, wherein the flexible light-emitting panel comprises an electroluminescence element.

* * * * *